(12) United States Patent
Li et al.

(10) Patent No.: US 12,532,779 B2
(45) Date of Patent: Jan. 20, 2026

(54) STACKED COMPLEMENTARY FIELD EFFECT TRANSISTOR (CFET) AND METHOD OF MANUFACTURE

(71) Applicant: QUALCOMM Incorporated, San Diego, CA (US)

(72) Inventors: Xia Li, San Diego, CA (US); Bin Yang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 607 days.

(21) Appl. No.: 17/812,300

(22) Filed: Jul. 13, 2022

(65) Prior Publication Data
US 2024/0021586 A1 Jan. 18, 2024

(51) Int. Cl.
*H01L 25/00* (2006.01)
*H01L 25/07* (2006.01)
*H01L 23/00* (2006.01)
*H10D 30/67* (2025.01)
*H10D 62/40* (2025.01)

(52) U.S. Cl.
CPC ............ *H01L 25/074* (2013.01); *H01L 25/50* (2013.01); *H01L 24/08* (2013.01); *H01L 24/80* (2013.01); *H01L 2224/08145* (2013.01); *H01L 2224/80896* (2013.01); *H01L 2924/13069* (2013.01);
(Continued)

(58) Field of Classification Search
CPC ........ H01L 25/074; H01L 25/50; H01L 24/08
See application file for complete search history.

(56) References Cited

U.S. PATENT DOCUMENTS 11,837,604 B2   12/2023   Cheng et al.
2013/0122672 A1   5/2013   Or-Bach et al.
(Continued)

FOREIGN PATENT DOCUMENTS

DE   102019121928 A1   3/2020
WO   2018118210 A1   6/2018
WO   2023099112 A1   6/2023

OTHER PUBLICATIONS

Batude, P. et al., "3D sequential integration: applications and associated key enabling modules (design & technology)," 2021 IEEE International Electron Devices Meeting (IEDM), Dec. 11-16, 2021, San Francisco, CA, USA, IEEE, 4 pages.
(Continued)

*Primary Examiner* — Thao P Le
(74) *Attorney, Agent, or Firm* — Withrow & Terranova, PLLC

(57) ABSTRACT

A stacked gate-all-around (GAA) complementary field-effect transistor (CFET) includes a first GAA FET of a first type and a second GAA FET of a second type. Each of the first GAA FET and the second GAA FET includes at least one three-dimensional (3D) semiconductor slab with a channel region and a first surface. A first gate structure surrounds the channel region in the first GAA FET, and a second gate structure surrounds the channel region in the second GAA FET. The first gate structure is stacked opposite the second gate structure in a direction orthogonal to the first surface. In some examples, a first crystal structure of the 3D semiconductor slab in the first GAA FET has a first orientation, and a second crystal structure of the 3D semiconductor slab in the second GAA FET has a different orientation for improved carrier mobility.

20 Claims, 18 Drawing Sheets

(52) U.S. Cl.
CPC ..... *H10D 30/6735* (2025.01); *H10D 30/6757* (2025.01); *H10D 62/40* (2025.01)

(56) References Cited

U.S. PATENT DOCUMENTS

| | | | | |
|---|---|---|---|---|
| 2015/0061026 | A1* | 3/2015 | Lin | H10D 88/00 |
| | | | | 257/369 |
| 2020/0052133 | A1* | 2/2020 | Chen | B82Y 10/00 |
| 2020/0075592 | A1 | 3/2020 | Liebmann et al. | |
| 2020/0203342 | A1* | 6/2020 | Chen | H01L 21/02636 |
| 2020/0235098 | A1* | 7/2020 | Li | H10D 30/6735 |
| 2021/0218398 | A1 | 7/2021 | Hung et al. | |
| 2021/0242125 | A1* | 8/2021 | Do | H10D 30/6757 |
| 2021/0305278 | A1 | 9/2021 | Shiraki | |
| 2022/0122892 | A1 | 4/2022 | Smith et al. | |
| 2022/0123023 | A1* | 4/2022 | Peng | H10D 86/441 |
| 2022/0375935 | A1 | 11/2022 | Yim et al. | |
| 2023/0027780 | A1* | 1/2023 | Kang | H01L 23/5286 |
| 2023/0036597 | A1 | 2/2023 | Smith et al. | |
| 2023/0068364 | A1* | 3/2023 | Choi | H10D 84/85 |
| 2023/0178435 | A1 | 6/2023 | Huang et al. | |
| 2023/0178554 | A1 | 6/2023 | Chehab et al. | |
| 2023/0326925 | A1 | 10/2023 | Cockburn et al. | |
| 2023/0377998 | A1 | 11/2023 | Smith | |
| 2023/0386928 | A1 | 11/2023 | Chan et al. | |
| 2023/0420531 | A1* | 12/2023 | Lavric | H10D 84/0181 |
| 2023/0420544 | A1 | 12/2023 | Mertens et al. | |
| 2024/0047342 | A1 | 2/2024 | Smith et al. | |
| 2024/0047455 | A1* | 2/2024 | Li | H10D 84/0167 |
| 2025/0024745 | A1* | 1/2025 | Lao | G06F 1/203 |
| 2025/0048690 | A1* | 2/2025 | Chehab | H10D 88/01 |

OTHER PUBLICATIONS

Clark, "Selective and Atomic Scale Processes for Advanced Semiconductor Manufacturing," 2021 IEEE International Electron Devices Meeting (IEDM), Dec. 11-16, 2021, San Francisco, CA, USA, IEEE, 55 pages.

Colombeau, B., "Processes and Materials Engineering Innovations for Advanced Logic Transistor Scaling," 2021 IEEE International Electron Devices Meeting (IEDM), Dec. 11-16, 2021, San Francisco, CA, USA, IEEE, 44 pages.

Koret, R., "Metrology and Material Characterization for the Era of 3D Logic and MemorY," 2021 IEEE International Electron Devices Meeting (IEDM), Dec. 11-16, 2021, San Francisco, CA, USA, IEEE, 61 pages.

Liebmann, L. et al., "CFET Design Options, Challenges, and Opportunities for 3D Integration," 2021 IEEE International Electron Devices Meeting (IEDM), Dec. 11-16, 2021, San Francisco, CA, USA, IEEE, 4 pages.

Lin, C.-H., "Beyond FinFET Devices: GAA, CFET, 2D Material FET," 2021 IEEE International Electron Devices Meeting (IEDM), Dec. 11-16, 2021, San Francisco, CA, USA, IEEE, 56 pages.

Yang, M. et al., "Hybrid-Orientation Technology (HOT): Opportunities and Challenges," IEEE Transactions on Electron Devices, vol. 53, No. 5, May 2006, pp. 965-978.

Zhao, Kai, "Beyond FINFET era Challenges and Opportunities for CMOS Technology," 2021 IEEE International Electron Devices Meeting (IEDM), Dec. 11-16, 2021, San Francisco, CA, USA, IEEE, available online: <URL: https://static1.squarespace.com/static/607da9820de541322b95fc19/t/60f99782c7127c7fcf0a2ebf/1626969986848/1-KaiZhao.pdf >, 57 pages.

Radosavljevic, M. et al., "Opportunities in 3-D stacked CMOS transistors," 2021 IEEE International Electron Devices Meeting (IEDM), Dec. 11-16, 2021, San Francisco, CA, USA, IEEE 4 pages.

Invitation to Pay Additional Fees and Partial International Search for International Patent Application No. PCT/US2023/023977, mailed Sep. 22, 2023, 9 pages.

International Search Report and Written Opinion for International Patent Application No. PCT/US2023/023981, mailed Sep. 13, 2023, 21 pages.

International Search Report and Written Opinion for International Patent Application No. PCT/US2023/023977, mailed Nov. 7, 2023, 20 pages.

\* cited by examiner

BOND SECOND LAYER (134) TO THE THIRD LAYER (138) WITH THE SECOND GATE STRUCTURE (118) OPPOSITE THE FIRST GATE STRUCTURE (110) AND ANNEAL

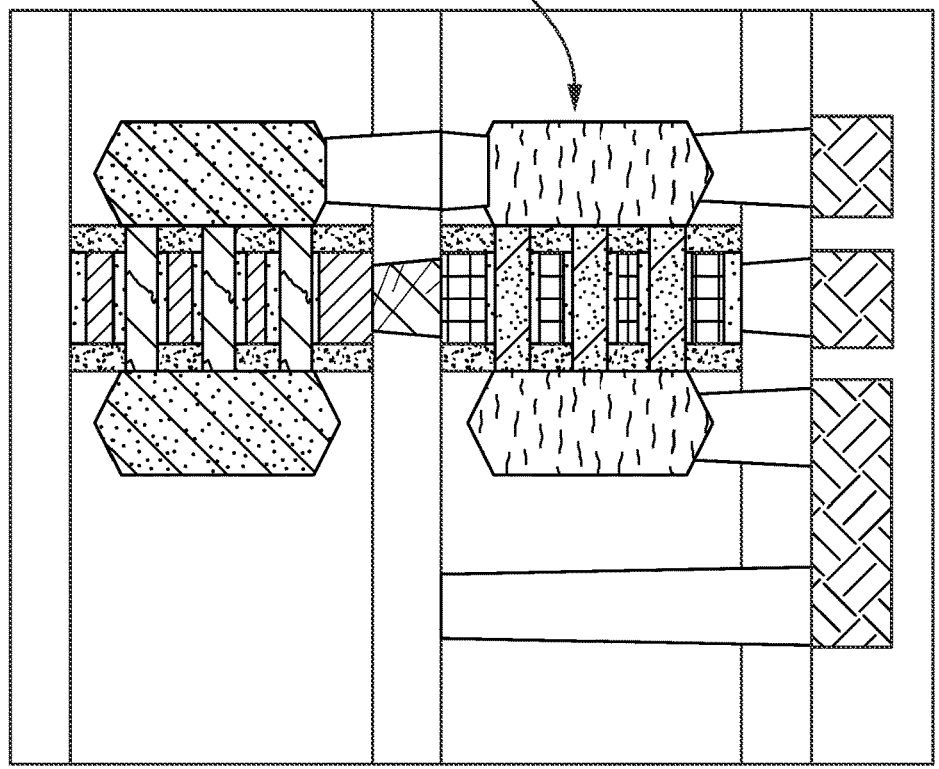

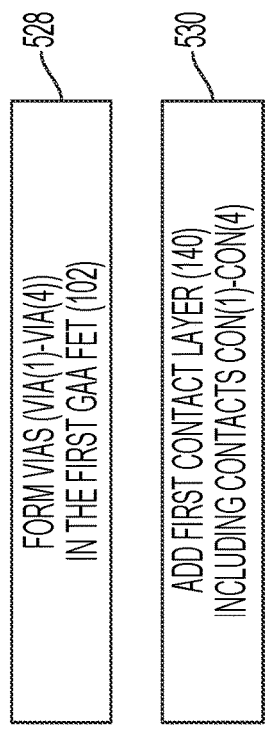
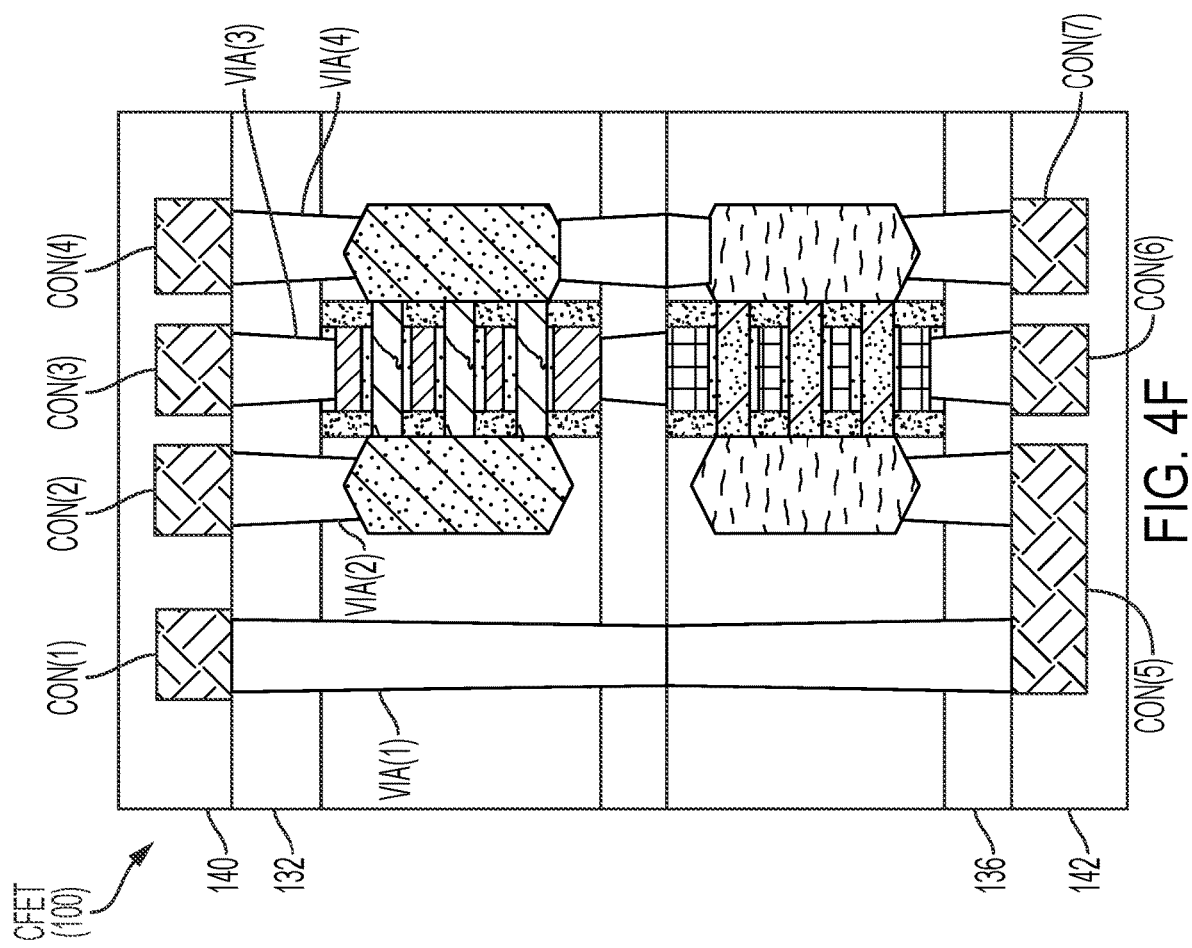
FIG. 4F
FIG. 5F

STACKED COMPLEMENTARY FIELD EFFECT TRANSISTOR (CFET) AND METHOD OF MANUFACTURE

BACKGROUND

I. Field of the Disclosure

The technology of the disclosure relates generally to complementary metal-oxide semiconductor (CMOS) field-effect transistors (FETs) (CFETs) and particularly to stacked FETs.

II. Background

Integrated circuits (ICs) are responsible for performing a wide variety of functions with a high level of performance in electronic devices. There is constant market pressure to minimize the size of electronic devices, which provides a motivation to reduce the size of ICs. Complementary metal-oxide semiconductor (CMOS) technology is commonly employed in ICs for its power savings, improved performance, and better noise immunity compared to circuits employing only N-type (MOS) (NMOS) or P-type MOS (PMOS) technology. However, each CMOS transistor includes both a PMOS transistor, such as a P-type field effect transistor (FET) (PFET) and an NMOS transistor (e.g., NFET). Whether the PFET and NFET of a CFET are vertical stack, Fin-type, or gate-all-around (GAA) FETs, each CFET in a circuit includes the area occupied by at least one PFET and at least one NFET. Since there may be millions of instances of a circuit in an IC, the area of a circuit can significantly impact the area of the IC. In addition, the carrier mobility of NFETs is significantly higher than the carrier mobility of PFETs, so PFETs are often sized-up to compensate for this difference to provide a more balanced performance, further increasing the CMOS transistor circuit cell area. Thus, there is a desire for CMOS devices with reduced circuit cell area while maintaining balanced performance.

SUMMARY

Aspects disclosed in the detailed description include a stacked complementary field-effect transistor (FET) (CFET). Related methods of manufacturing a stacked CFET are also disclosed. A stacked gate-all-around (GAA) CFET includes a first GAA FET of a first type and a second GAA FET of a second type. Each of the first GAA FET and the second GAA FET includes at least one three-dimensional (3D) semiconductor slab with a channel region and a first surface. A first gate structure surrounds the channel region in the first GAA FET, and a second gate structure surrounds the channel region in the second GAA FET. The first gate structure is stacked opposite the second gate structure in a direction orthogonal to the first surface. In some examples, the stacked GAA CFET is a hybrid CFET wherein a first crystal structure of the 3D semiconductor slab in the first GAA FET has a first orientation, and a second crystal structure of the 3D semiconductor slab in the second GAA FET has a second orientation different than the first orientation for improved carrier mobility.

In an exemplary aspect, a stacked CFET is disclosed. The stacked (TEL comprises a first GAA FET of a first type. The first GAA FET comprises a first channel region comprising a first crystal structure comprising a first orientation. The first GAA FET comprises a first gate structure surrounding the first channel region. The stacked CFET comprises a second GAA FET of a second type, the second GAA FET comprising a second channel region comprising a second crystal structure comprising a second orientation different than the first orientation. The second GAA FET comprises a second gate structure surrounding the second channel region.

In another exemplary aspect, a method of making a stacked CFET is disclosed. The method comprises forming a first GAA FET of a first type, the first GAA FET comprising a first channel region. The method comprises forming a first gate structure surrounding the first channel region. The method comprises forming a second GAA FET of a second type, the second GAA FET comprising a second channel region. The method comprises forming a second gate structure surrounding the second channel region. The first channel region comprises a first crystal structure comprising a first orientation and the second channel region comprises a second crystal structure comprising a second orientation different than the first orientation.

BRIEF DESCRIPTION OF THE DRAWINGS

FIGS. 4A-4F are illustrations of cross-sectional side views of stages of fabrication in a method of fabricating the stacked GAA CFET in FIG. 1;

FIGS. 5A-5F are a flowchart of a method in the corresponding stages of fabrication of the stacked GAA CFETs shown in FIGS. 4A-4F;

DETAILED DESCRIPTION

Figure 1:
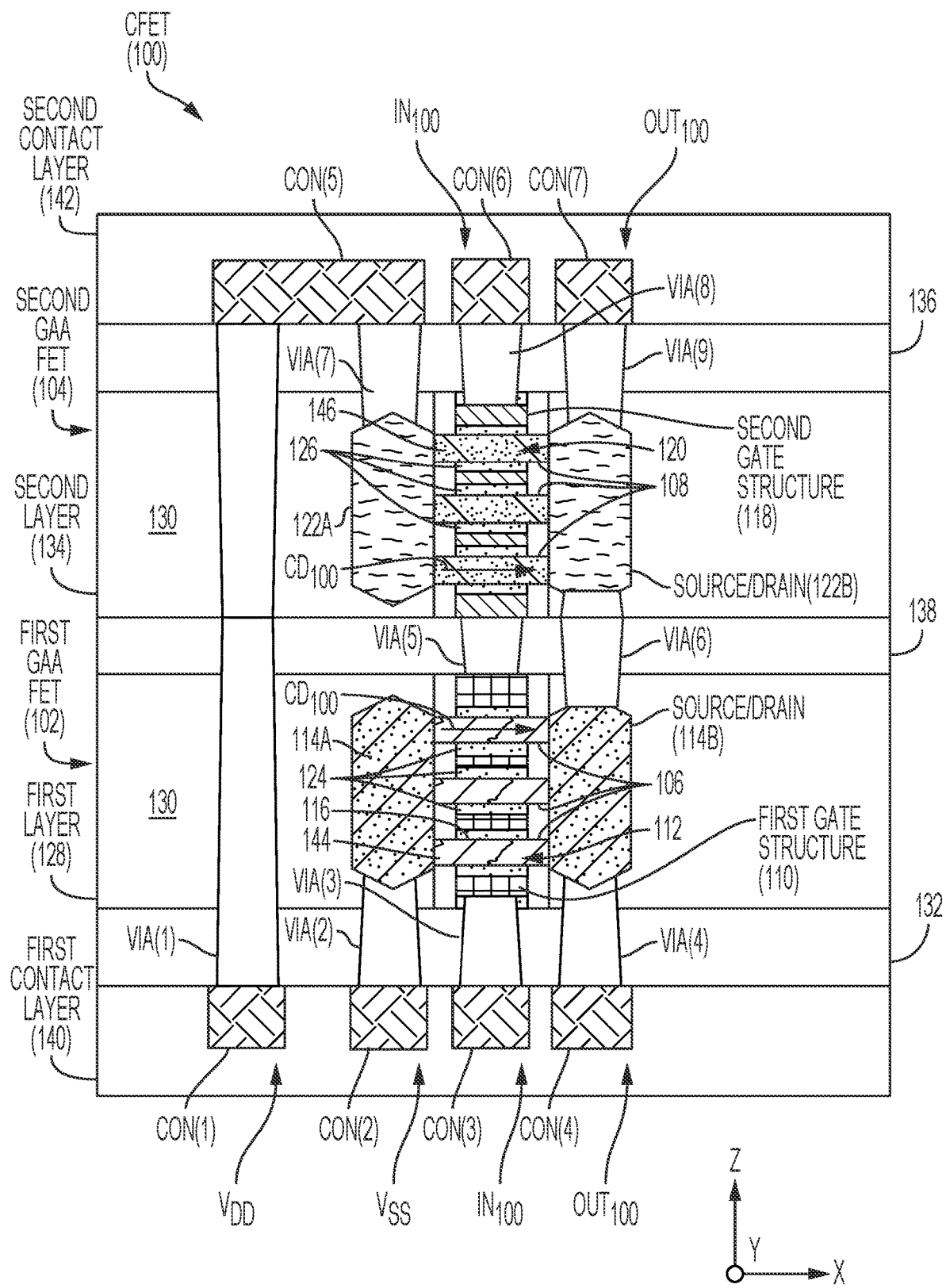
FIG. 1 is an illustration of a cross-sectional side view of a stacked gate-all-around (GAA) complementary field-effect transistor (FET) (CFET), including a first GAA FET of a first type stacked opposite a second GAA FET of a second type.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include stacked complementary field-effect transistor (FET) (CFET). Related methods of manufacturing stacked CFETs are also disclosed. A stacked gate-all-around (GAA) CFET includes a first GAA FET of a first type and a second GAA FET of a second type. Each of the first GAA FET and the second GAA FET includes at least one three-dimensional (3D) semiconductor slab with a channel region and a first surface. A first gate structure surrounds the channel region of the 3D semiconductor slab in the first GAA FET, and a second gate structure surrounds the channel region of the 3D semiconductor slab in the second GAA CFET. The first gate structure is stacked opposite the second gate structure in a third direction orthogonal to the surface. In some examples, the stacked GAA CFET is a hybrid CFET wherein a first crystal structure of the 3D semiconductor slab in the first GAA FET has a first orientation, and a second crystal structure of the 3D semiconductor slab in the second GAA FET has a second orientation different than the first orientation for improved carrier mobility.

FIG. 1 is an illustration of a cross-sectional side view of a stacked GAA CFET circuit 100 ("CFET 100"), including a first GAA FET 102 of a first type stacked opposite to a second GAA FET 104 of a second type. In one aspect, the CFET 100 is an example of a complementary metal-oxide semiconductor (CMOS) inverter that occupies a substrate area of the first GAA FET 102, providing an area reduction over conventional CMOS inverters disposed adjacent to each other on the substrate. In another aspect, the CFET 100 is a hybrid CFET in which 3D semiconductor slabs 106 of the first GAA FET 102 have a different surface orientation than 3D semiconductor slabs 108 of the second GAA FET 104 for improved performance, as explained further below. The GAA CFET 100 may be a cell circuit having a layout according to a cell design that can be placed in a die layout by a designer.

CMOS circuits provide increased performance, reduced power consumption, and better noise tolerance than circuits with only one type of FET but may include twice as many transistors. Stacking the first GAA FET 102 and the second GAA FET 104 opposite each other may significantly reduce (e.g., by up to 50%) the area of a CMOS circuit compared to circuits having FETs of only one type. In this example, the first GAA YET 102 is of a first type that provides a good reference voltage source (e.g., ground or $V_{SS}$), and the second GAA FET 104 is of a second type that provides a good supply voltage source (e.g., 1.8 volts or $V_{DD}$).

The terms "first type" and "second type" refer to one of N-type and P-type, which may also be referred to as N-channel and P-channel. In an N-type device, the semiconductor source and drain are doped with a pentavalent dopant, and a voltage applied to a gate in the channel region creates an N-channel in which electrons are the majority carrier. In a P-type or P-channel device, the semiconductor source and drain are doped with a trivalent dopant, and an applied gate voltage creates a P-channel in the channel region, wherein holes are the majority carriers. The 3D semiconductor slabs 106, 108 in P-type devices may include silicon (Si), silicon germanium (Site), germanium (Ge), gallium arsenide (GaAs), or compounds thereof. The 3D semiconductor slabs 106, 108 in N-type devices may include Si, GaAs, or compounds thereof.

The first GAA FET 102 includes three 3D semiconductor slabs 106 but may have fewer or more. A first gate structure 110 surrounds the 3D semiconductor slabs 106 (e.g., on all sides) in a channel region 112. The first GAA FET 102 also includes epitaxial source/drains 114A and 114E coupled to opposite ends of the 3D semiconductor slabs 106. The second GAA FET 104 includes three 3D semiconductor slabs 108 but may have fewer or more. The 3D semiconductor slabs 106 include a surface 116 extending in an X-axis direction and a Y-axis direction. A second gate structure 118 surrounds the 3D semiconductor slabs 108 in a channel region 120. The first gate structure 110 is stacked opposite the second gate structure 118 in a Z-axis direction. The second GAA FET 104 also includes epitaxial regions 122A and 122B, also referred to herein as epitaxial source/drains 122A and 122B, coupled to opposite ends of the 3D semiconductor slabs 108. The first gate structure 110 is insulated from the 3D semiconductor slabs 106 by insulator layers 124, and the second gate structure 118 is insulated from the 3D semiconductor slabs 108 by insulator layers 126.

The first GAA PET 102 is disposed in a first layer 128, which includes a layer fill material 130, which is an insulator or dielectric material. The first layer 128 is disposed adjacent to a first base layer 132, which is also an electrical insulator and/or dielectric material. The second GAA FET 104 is disposed in a second layer 134 that may also include the fill material 130. The second layer 134 is disposed adjacent to a second base layer 136. The first base layer 132 and the second base layer 136 may be insulator layers, which may comprise an oxide material. Between the first layer 128 and the second layer 134, the CFET 100 includes a third layer 138. In some examples, as described below, the third layer 138 is a bonding layer for bonding the second layer 134 to the first layer 128. In other examples, the third layer 138 may be a base layer formed on the first layer 128 before the second layer 134 is formed.

The CFET 100 also includes a first contact layer 140 and a second contact layer 142, which include contacts CON (1)-CON(7), which are electrically coupled to one or both of the first GAA FET 102 to the second GAA FET 1.04 by vias VIA(1)-VIA(9). The contacts CON(1)-CON(7) may couple the first GAA FET 102 to the second GAA FET 104 and provide connections to external circuits. The number of the contacts CON(1)-CON(7) and vias VIA(1)-VIA(9) may vary depending on configurations of the CFET 100.

The first gate structure 110 and the second gate structure 118 are electrically coupled to each other. Such electrical coupling may be internal, by way of the via VIA(5) extending from the first gate structure 110 to the second gate structure 118 through the third layer 138. In other examples, the first gate structure 110 and the second gate structure 118 may be electrically coupled to each other in another manner, internally or externally, rather than by the via VIA(5). Due to the first gate structure 110 being electrically coupled to the second gate structure 118, a binary input IN too may be supplied to the CFET 100 by either one of the contacts CON(3) or CON(6). In an example in which the first GAA FET 102 is an N-type FET and the second GAA FET 104 is a P-type FET, the source/drain 114A is coupled to the reference voltage $V_{SS}$ by the via VIA(2), and the contact CON(2) and the source/drain 122A are coupled to the supply voltage $V_{DD}$ by the vias VIA(7) and VIA(1) and the contacts CON(5) and CON(1). A binary output $OUT_{100}$ having a binary state that is the inverse of the binary input $IN_{100}$ is provided through one of the source/drain 114B or 122B to the contacts CON(4) and CON(7), which are coupled by vias VIA(4), VIA(6), and VIA(8). A channel direction $CD_{100}$ through the 3D semiconductor slabs 106 and a channel direction $CD_{100}$ through the 3D semiconductor slabs 108 are in the X-axis direction. (e.g., left to right) in FIG. 1. In this configuration, the CFET 100 may be coupled to an external circuit by way of the contacts CON(1)-CON(4) in the first contact layer 140, but in an alternative arrangement of contacts, the CFET 100 could be coupled to an external circuit by way of the second contact layer 142.

As explained further below with reference to FIGS. 2-6H, the first GAA FET 102 and the second GAA FET 104 may be fabricated separately as silicon-on-insulator (SOI) devices or bulk semiconductor devices. After being separately fabricated, the first GAA FET 102 and the second GAA FET 104 may be bonded to each other by employing a layer transfer and stack process to form the CFET 100. Alternatively, the second GAA FET 104 may be fabricated separately on the first GAA FET 102.

Because the first GAA FET 1.02 and the second GAA FET 104 are fabricated separately, as disclosed in detail below, the 3D semiconductor slabs 106 of the first GAA FET 102 are fabricated separately from the 3D semiconductor slabs 108 of the second GAA FET 104. Therefore, a crystal structure 144 of the 3D semiconductor slabs 106 can be formed with a different orientation than that of a crystal structure 146 of the 3D semiconductor slabs 108. In particular, in the example in which the first GAA FET 102 is an N-type FET, the crystal structure 144 may have (100) surface orientation, and the channel direction $D_{100}$ of <110> provides high electron mobility. For example, the second GAA FET 104 is a P-type FET in which the crystal structure 146 having a surface orientation of (110) and a hole mobility in the channel direction $D_{100}$ of <110> for better performance than a P-type FET in which the crystal structure has a same surface orientation as the N-type FET. In conventional structures, the P-type FETs and N-type FETs formed on the same substrate have a common orientation (e.g., (100)), which hampers performance of P-type FETs. Forming the crystal structure 146 separately with the surface orientation (110) increases performance of the P-type second GAA FET 104 by up to 15%. In addition, forming the P-type FET (e.g., the second GAA FET 104 separately from or after forming the N-type FET (e.g., the first GAA FET 102), the P-type FET does not need to be subjected to a high-temperature process (e.g., annealing) used in the fabrication of N-type FETs, which may cause degradation of the P-type FETs.

Figure 2:
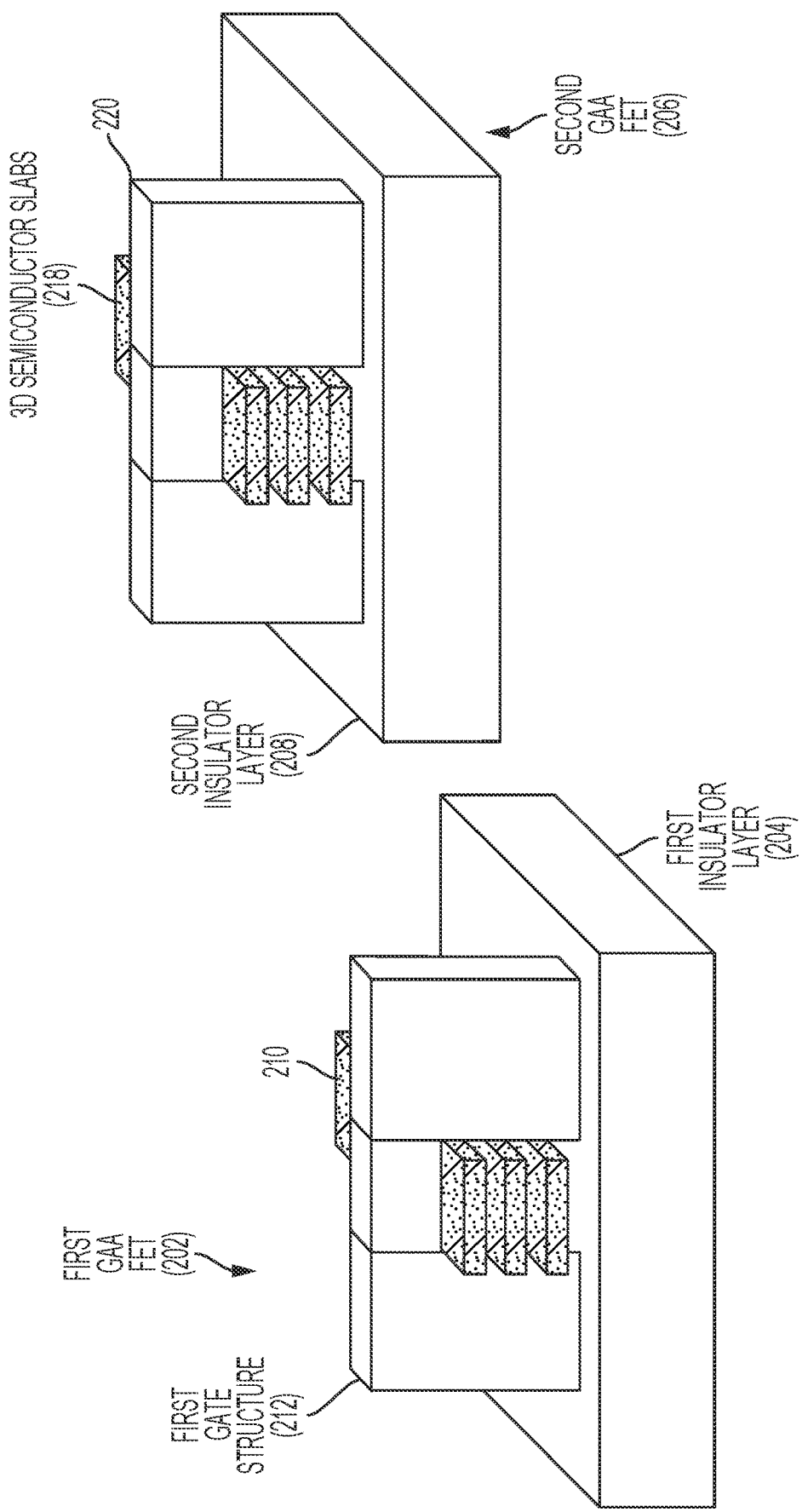
FIG. 2 is an illustration of a first GAA FET formed on a first insulator and a second GAA FET formed on a second insulator so the crystal structures of the three-dimensional (3D) semiconductor slabs of the first GAA FET and the second GAA FET can be formed with different orientations.

FIG. 2 is an illustration of a first GAA FET 202 formed on a first insulator layer 204 and a second GAA FET 206 firmed on a second insulator layer 208. The first GAA FET 202 and the second GAA FET 206 may be the first GAA FET 102 and the second GAA FET 104 in FIG. 1. In the example in FIG. 2, the first GAA FET 202 is an N-type FET including 3D semiconductor slabs 210 and a first gate structure 212. The first GAA FET 202 may be formed on the first insulator layer 204 after the first insulator layer 204 is formed on a substrate (not shown). The first insulator layer 204 may be formed of an oxide, such as silicon dioxide ($SiO_2$) or another suitable insulator material, and the substrate may be a semiconductor substrate (e.g., silicon). The substrate may be subsequently removed from the first insulator layer 204. In this example, the second GAA FET 206 is a P-type FET including 3D semiconductor slabs 218 and a second gate structure 220.

The first GAA FET 202 and the second GAA FET 206 in FIG. 2 are shown in a perspective view prior to formation of epitaxial regions (epitaxial source/drains) at either end of the 3D semiconductor slabs 210 and 218 to more clearly present features of the cross-sectional view in FIG. 1. Here, it can be seen that the first gate structure 212 is formed on the first insulator layer 204, and the second gate structure 220 is formed on the second insulator layer 208.

As noted above, the first GAA FET 102 is formed in a first layer 128 comprising fill material 130, but such fill material is not included in FIG. 2 in order to simplify the illustration in FIG. 2. In the stacking process, the second GAA FET 206 may be inverted for stacking face to face on the first GAA FET 202. A bonding layer (not shown) corresponding to the third layer 138 in FIG. 1 may be included to bond the first GAA FET 202 to the second GAA FET 206. In an alternative example, the second GAA FET 206 may be stacked as shown for face-to-back bonding with the first GAA FET 202.

Figure 3:
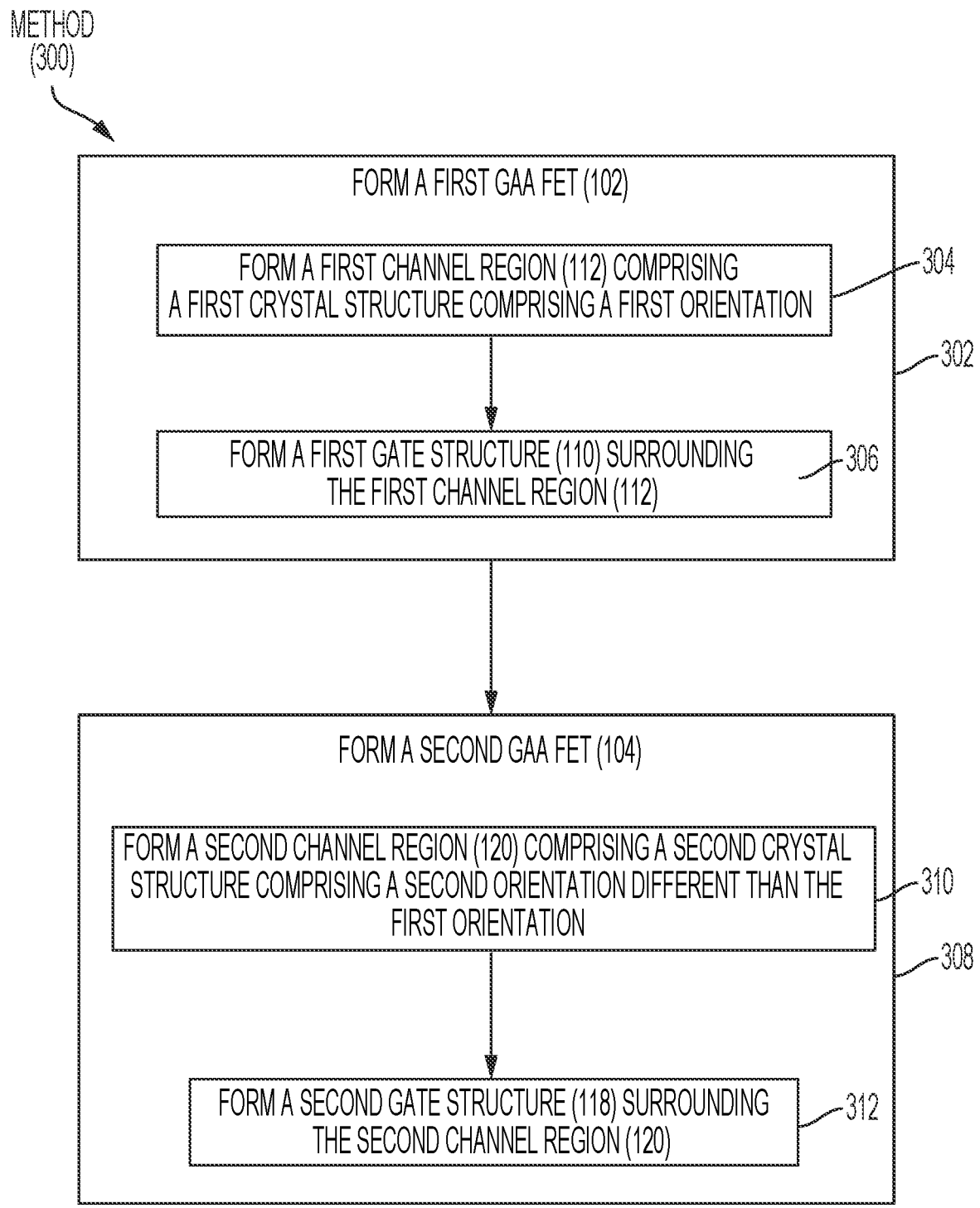
FIG. 3 is a flowchart of a method of making the stacked GAA CFET in FIG. 1.

FIG. 3 is a flowchart of a method 300 of making the stacked GAA CFET 100 in FIG. 1. The method includes forming a first GAA FET 102 of a first type (block 302), comprising forming a first channel region 112 comprising a first crystal structure comprising a first orientation (block 304). The method of forming the first GAA FET 102 includes forming a first gate structure 110 surrounding the first channel region 112 (block 306). The method includes forming a second GAA FET 104 (308), comprising forming a second channel region 120 comprising a second crystal structure comprising a second orientation different than the first orientation (block 310). The method of forming the second. GAA FET includes forming a second gate structure 118 surrounding the second channel region 120 (block 312).

Figure 4A:
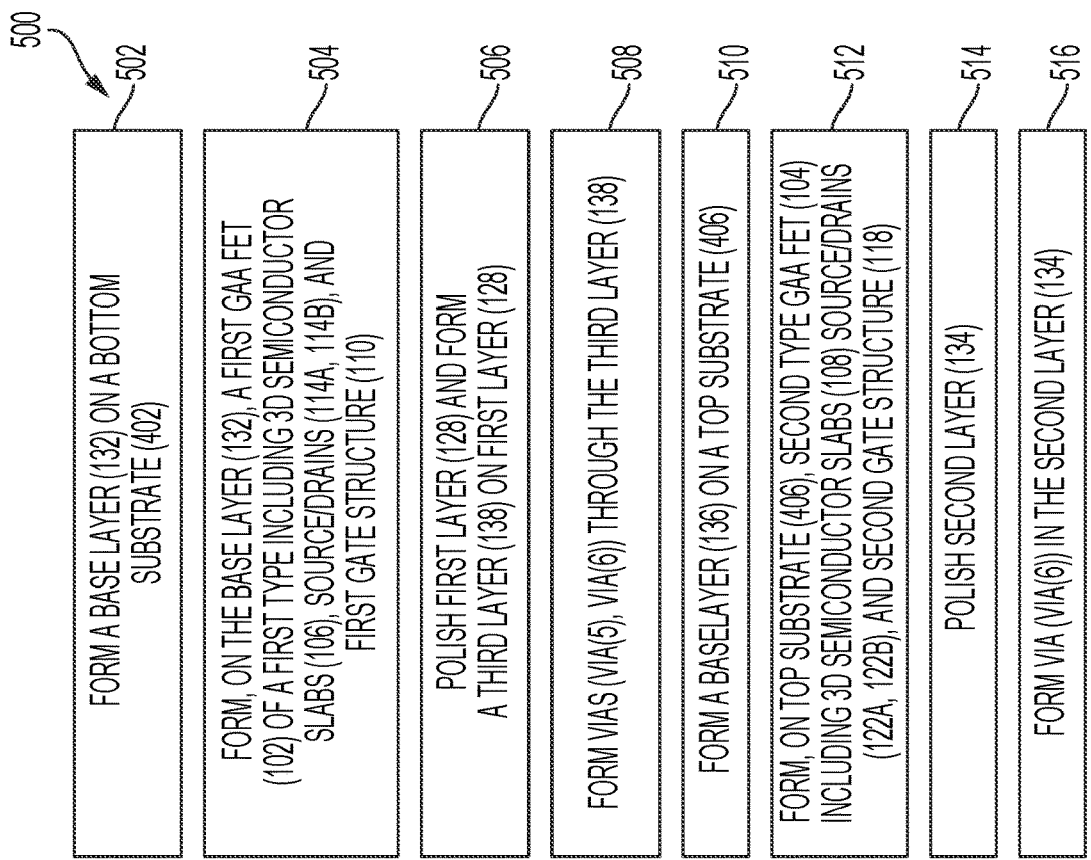
Figure 5A:
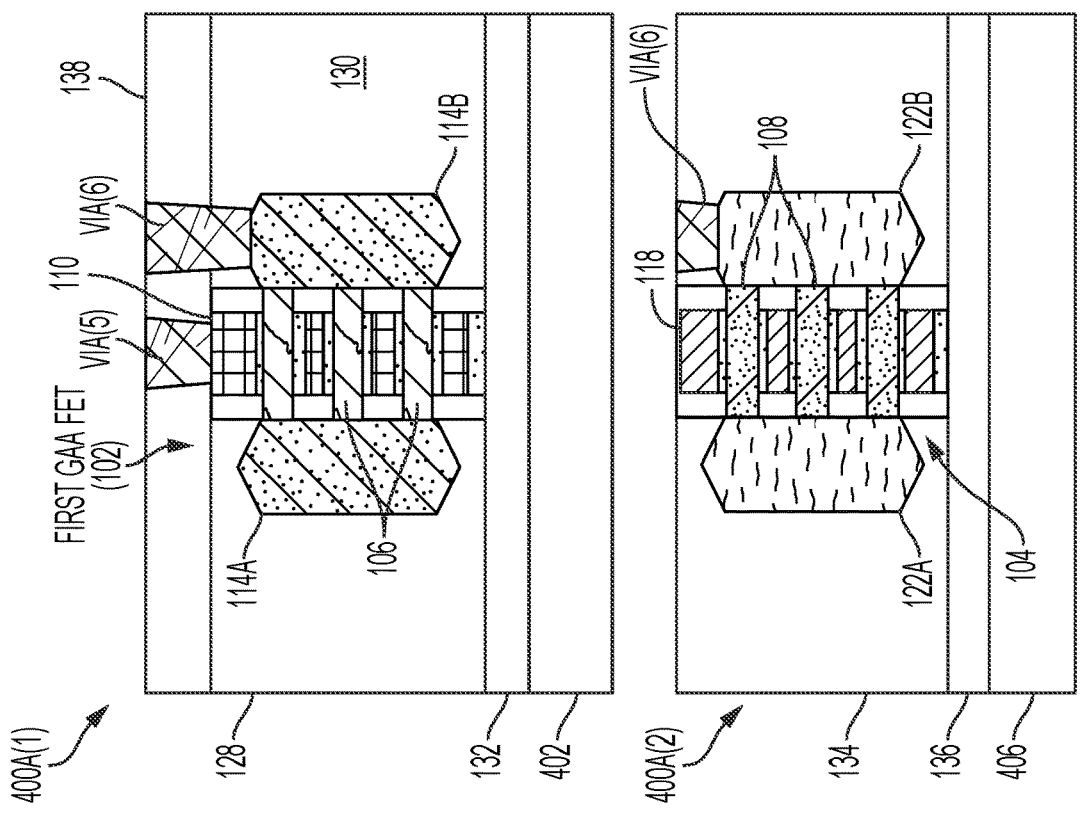

FIGS. 4A-4F are illustrations of cross-sectional side views of stages 400A(1)-400F of fabricating the CFET 100 in FIG. 1, and FIGS. 5A-5F are a flowchart of the method 500 corresponding to the stages of fabrication of the CFET 100 in FIGS. 4A-4F. FIG. 4A includes fabrication stage 400A(1) of the first GAA FET 102 in FIG. 1. The method includes forming a first base layer 132 on a bottom substrate 402 (block 502) and forming, on the first base layer 132, a first GAA FET 102 of a first type including 3D semiconductor slabs 106, source/drains 114A,114B, and the first gate structure 110 (block 504). In this example, the first GAA FET 102 is a silicon-on-insulator (SOI) transistor formed on the bottom substrate 402. The bottom substrate 402 is an insulator layer, which may be an oxide layer (e.g., $SiO_2$). The bottom substrate 402 may be formed on a support substrate (not shown), such as a semiconductor substrate, before formation of the first GAA FET 102, and the semiconductor substrate is later removed. Alternatively, in some examples, the first GAA FET 102 may be a bulk silicon transistor, where the bottom substrate 402 is a semiconductor (e.g., silicon) substrate, and the first GAA FET 102 is formed on an STI layer. Whether SOI or bulk, the first GAA FET 102 is formed in the first layer 128, including the fill material 130, such as an inter-layer dielectric (ILD). After formation of the first GAA FET 102 on the bottom substrate 402, the method includes polishing the first layer 128 and forming the third layer 138 on the first layer 128 (block 506). The polishing may be a chemical, mechanical polish (CMP), or other known method. The third layer 138 in this example is a bonding layer for bonding the first layer 128 to the second layer 134. The third layer 138 may comprise a bond oxide such as $SiO_2$. The method further includes forming vias VIA(5), VIA(6) through the third layer (138) (block 508).

FIG. 4A also includes fabrication stage 400A(2) of the second GAA FET 104. The second GAA FET 104 in this example is also an SOI with the top substrate 406 being an insulator layer, or may alternatively be a bulk transistor, in which case the top substrate 406 is a semiconductor substrate. The method 500 further includes forming the second base layer 136 on a top substrate 406 (block 510). The method includes forming, on the second base layer 136, the second layer 134 including the second GAA FET 104, which further includes the 3D semiconductor slabs 108, source/drains 122A, 122B, and second gate structure 118 (block 512). The method includes polishing (e.g., by CMP) the second layer 134 (block 514) and forming the via VIA(6) in the second layer 134 (block 516).

Figure 4B:
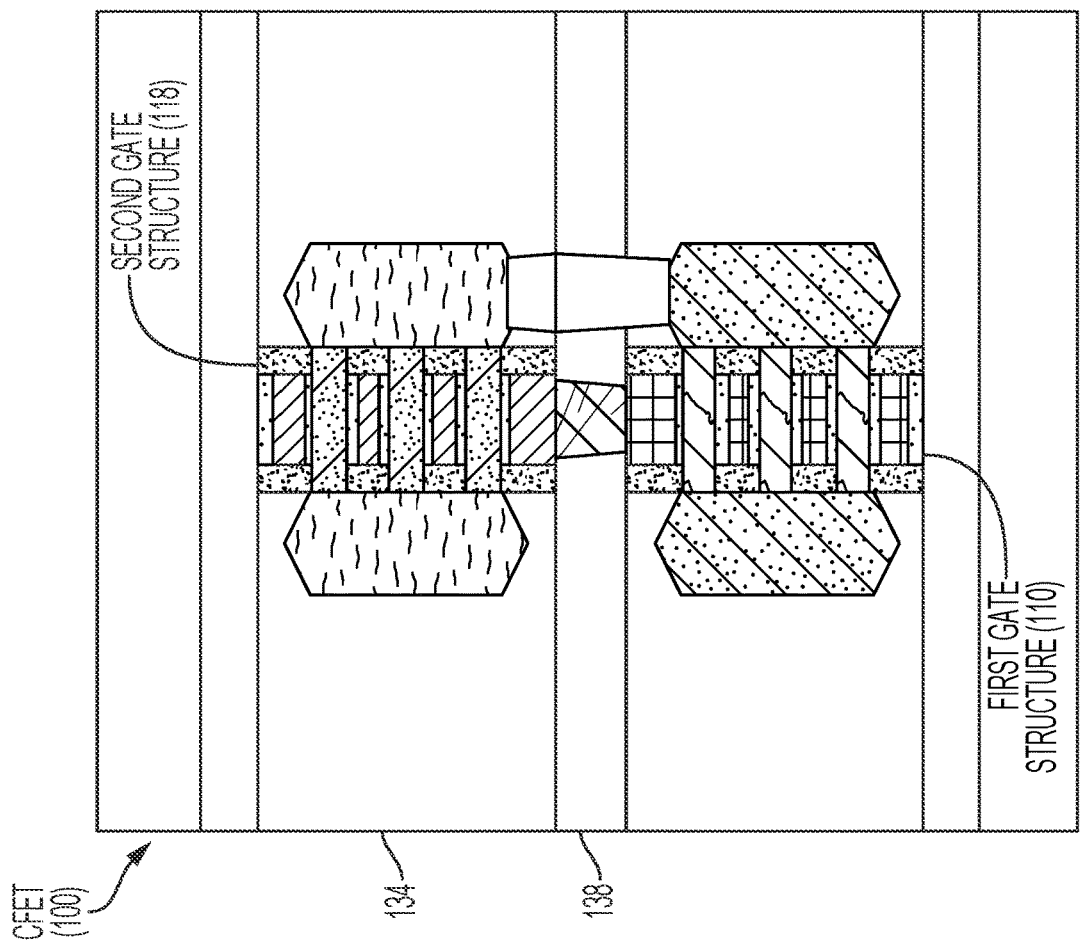
Figure 5B:
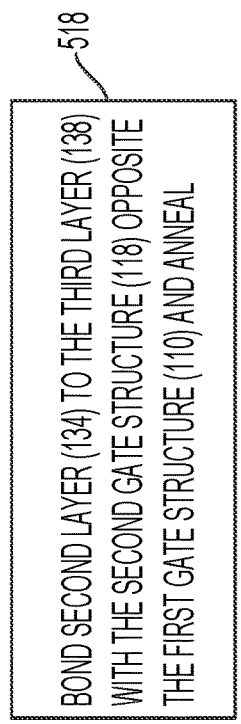

FIG. 4B includes fabrication stage 400B of the CFET 100 in the method 500, including bonding the second layer 134 to the third layer 138 with the second gate structure 118 opposite to the first gate structure 110 and anneal (block 518). In this regard, the term "opposite to" indicates that first gate structure 110 and the second gate structure 118 are directly opposite each other on opposite sides of the third layer 138, in a direction orthogonal to the third layer 138. The anneal process may be employed in a bonding process to secure an oxide to oxide bond of the third layer 138 to the second layer 134.

Figure 4C:
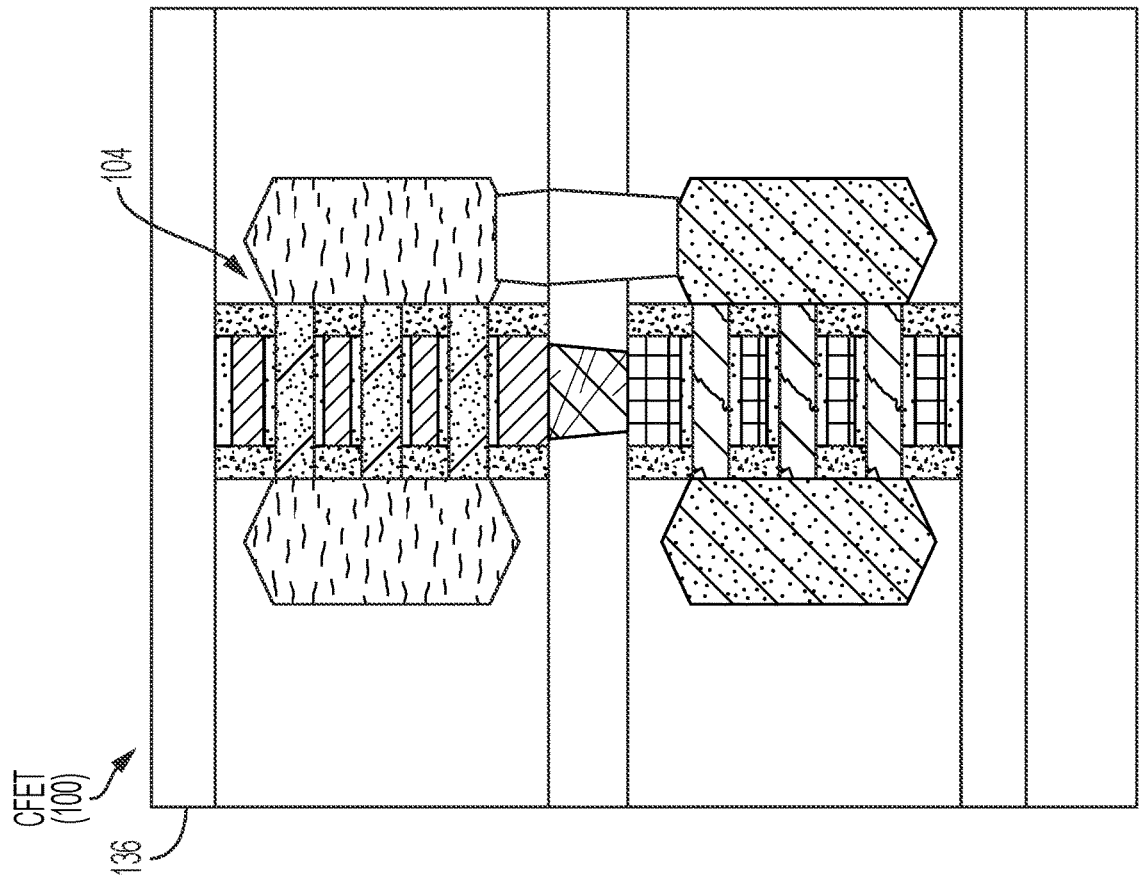
Figure 5C:
Figure 4D:
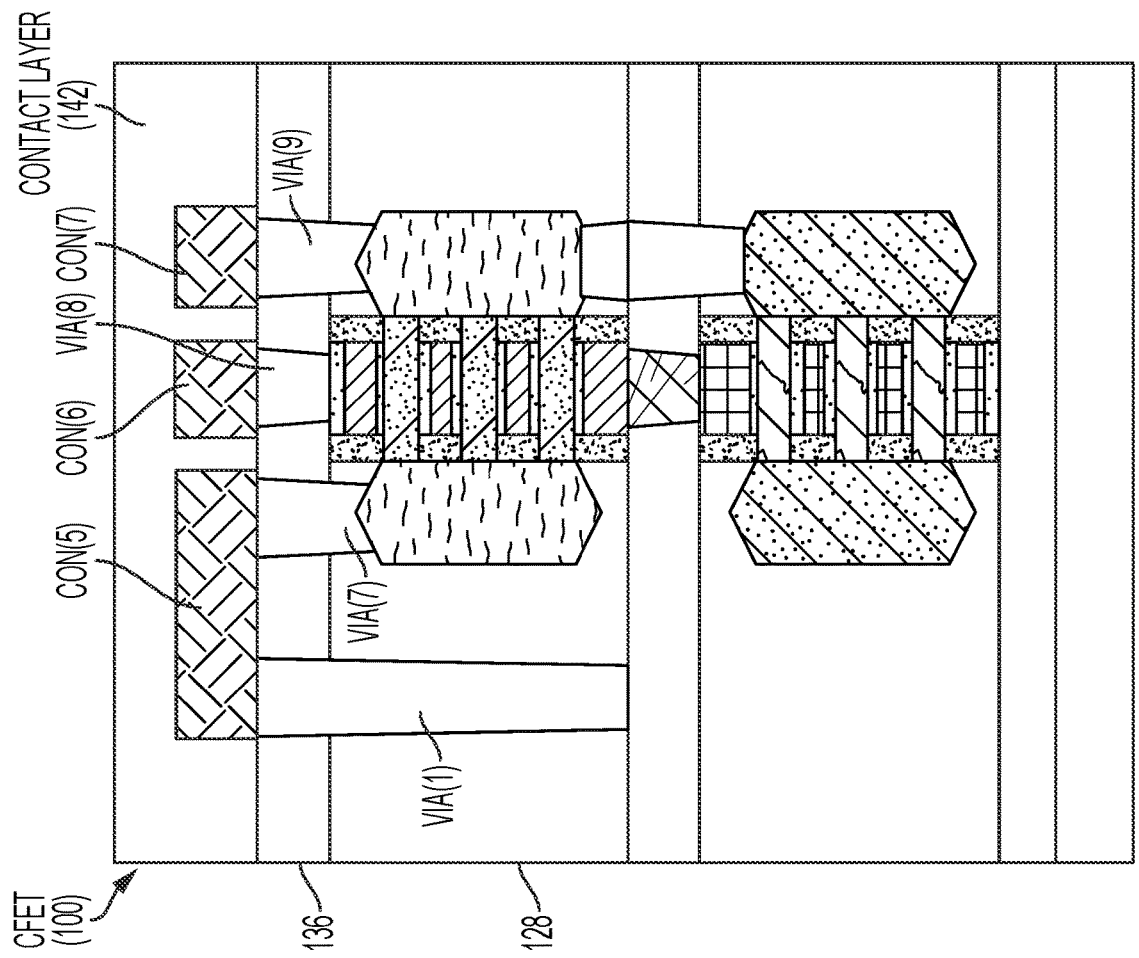
Figure 5D:
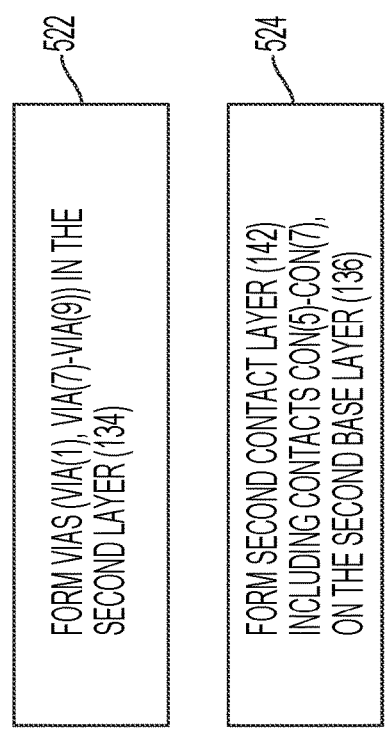

FIG. 4C includes stage 400C in fabrication of the CFET 100. The method in FIG. 5C includes removing the top substrate 406 from the second GAA YET 104 (block 520). Removing the top substrate 406 can include chemically and/or mechanically removing the top substrate 406 from the second base layer 136. FIG. 4D includes stage 400D in fabrication of the CFET 100. In accordance with stage 400D, the method 500 includes forming vias MA(1), VIA(7)-VIA (9)) in the second layer 134 (block 522) and form second contact layer 142, including contacts CON(5)-CON(7) on the second base layer 136 (block 524). Forming the vias VIA(1), VIA(7)-VIA(9)) includes forming vias (e.g., etching and filling with a conductive metal) through the second base layer 136 of the second GAA FET 104. Forming the second contact layer 142 may include first forming the contacts CON(5)-CON(7) on the second base layer 136 and disposing a dielectric on the second base layer 136 and over the contacts CON(5)-CON(7). Alternatively, the contacts CON(5)-CON(7) may be formed in the second base layer 136.

FIG. 4E includes stage 400E in the fabrication of the CFET 100. The method in FIG. 5E includes inverting the CFET 100 and removing the bottom substrate 402 from the first GAA FET 102 (block 526). Removing the bottom substrate 402 can include chemically and/or mechanically removing the bottom substrate 402 from the first base layer 132. FIG. 4F includes stage 400F in the fabrication of the CFET 100, and the method in FIG. 5F includes forming vias VIA(1)-VIA(4) in the first GAA FET 1.02 (block 528) and adding first contact layer 140, including the contacts CON (1)-CON(4) (block 530). The CFET 100 in FIG. 4F may be coupled to an external circuit from the first contact layer 140 or the second contact layer 142, which may include thinning the dielectric on one of the first and second contact layers (140, 142) to expose either the contacts (CON(1)-CON(4)) or (CON(1) and CON(5)-CON(7)).

In the CFET 100 fabricated by the method described above, the first GAA FET 102 of a first type may be either an N-type or P-type transistor and may be formed as either an SOI or bulk type transistor. In the above fabrication method, the first GAA FET 102 and the second GAA FET 104 are manufactured separately and, therefore, the 3D semiconductor slabs 106 and 108 can be formed to have crystal structures 144, 146 with different surface orientations for improved carrier mobility performance. In this regard, improved performance may include improved performance of the P-type FET without negatively impacting performance of the N-type FET for a more balanced performance. A relative improvement in performance of the P-type FET can avoid the need for up-sizing the P-type FET to achieve a more balanced performance. In this manner, a size of the CFET 100 may be reduced.

Figure 6:
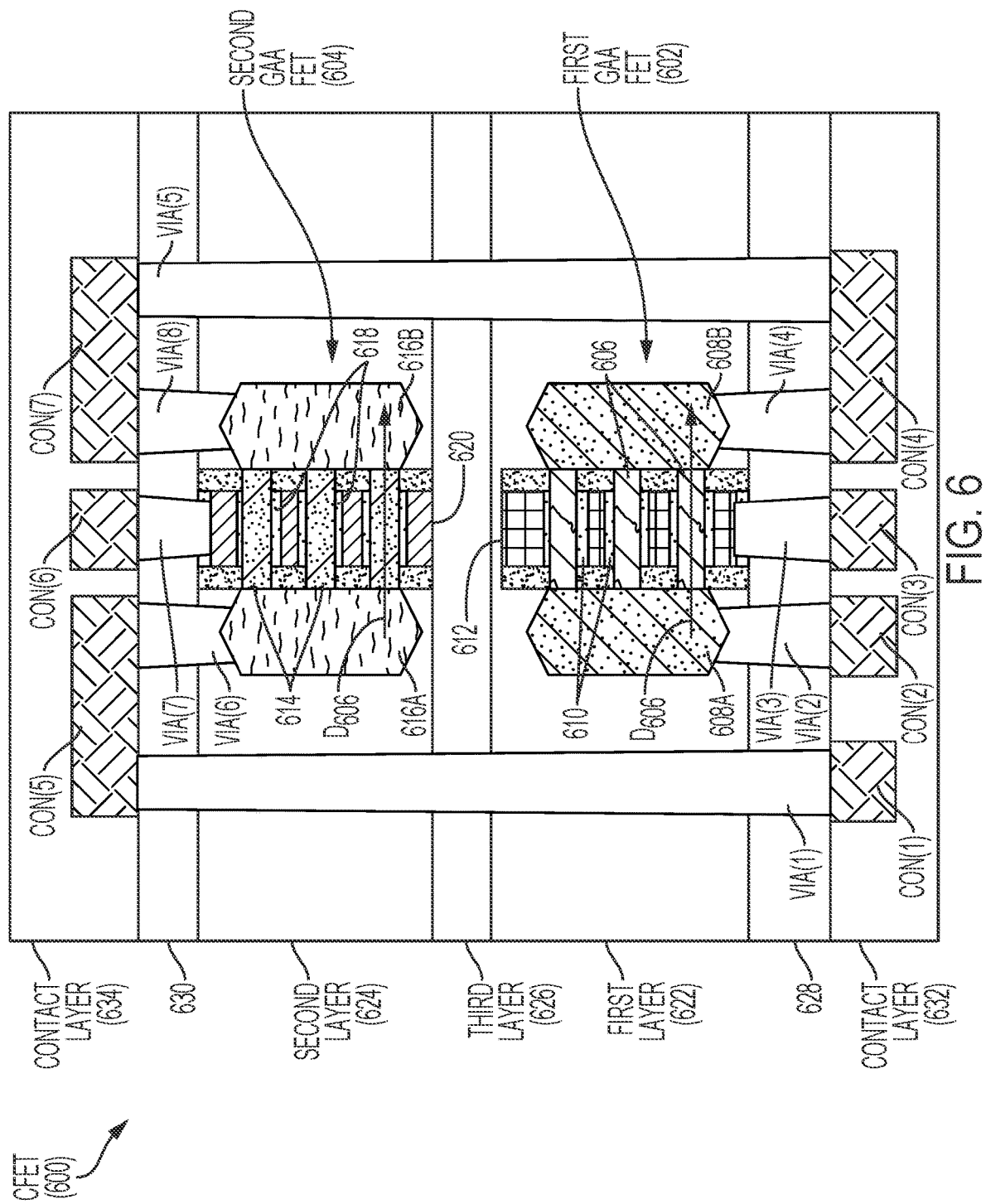
FIGS. 6-8 are illustrations of cross-sectional side views of other examples of stacked GAA CFETs formed on insulators.
Figure 7:
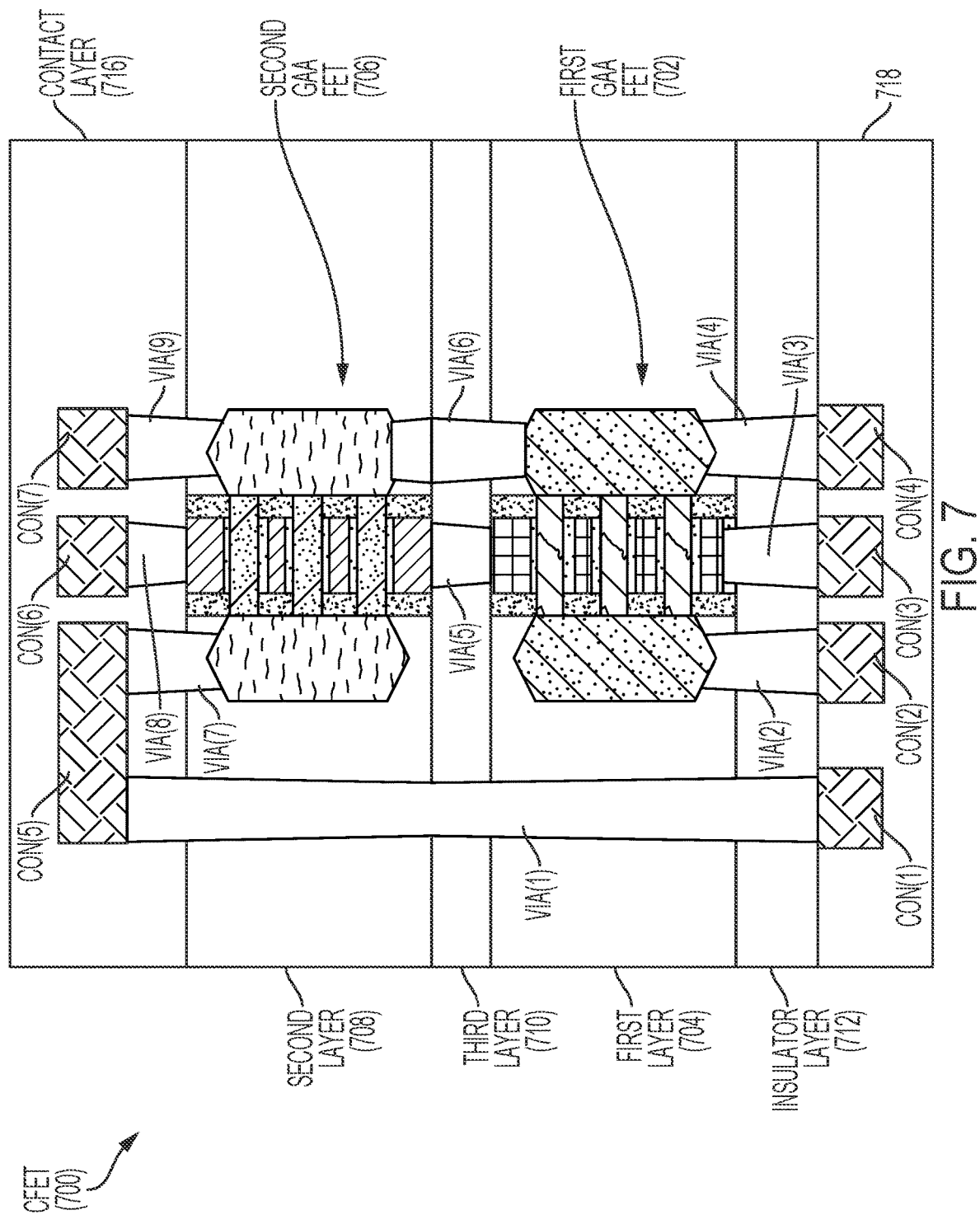
Figure 8:
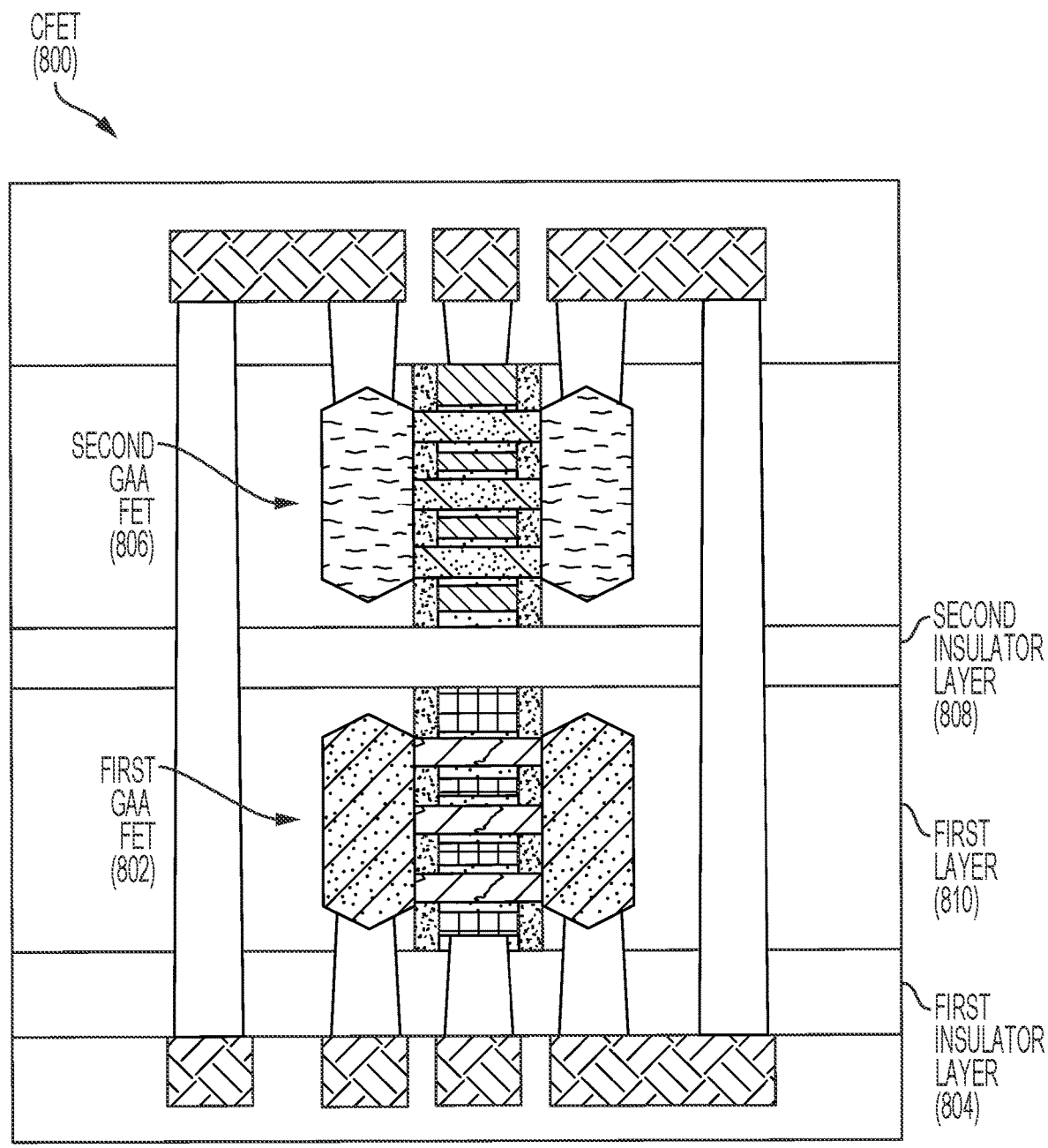

FIGS. 6-8 are illustrations of cross-sectional side views of other examples of stacked GAA CFET circuits with SOI transistors.

FIG. 6 is an illustration of a cross-sectional side view of a CFET 600 with a first GAA FET 602, which is an SOI transistor of a first type stacked face-to-face opposite to a second GAA FET 604, which is a second 501 transistor of a second type. The first GAA FET 602 includes 3D semiconductor slabs 606 with a channel direction $D_{606}$ extending in the X-axis direction between epitaxial source/drains (regions of epitaxially. grown material) 608A and 608B. Channel regions 610 of the 3D semiconductor slabs 606 are surrounded by a first gate structure 612. The second GAA FET 604 includes 3D semiconductor slabs 614, with the channel direction $D_{606}$ extending between the epitaxial source/drains 616A and 616B. Channel regions 618 of the 3D semiconductor slabs 614 are surrounded by a second gate structure 620. The first GAA FET 602 is formed in a first layer 622. The second GAA FET 604 is formed in a second layer 624. A third layer 626 between the first layer 622 and the second layer 624 may be in direct contact with the first layer 622 and the second layer 624. In this regard, the third layer 626 may be a bonding layer, bonding the first layer 622 to the second layer 624. The CFET 600 also includes a bottom base layer 628 on the first layer 622 and a top base layer 630 on the second layer 624. The CFET 600 also includes contact layers 632 and 634 firmed on the bottom base layer 628 and the top base layer 630, respectively.

In the aspects described above, the first GAA FET 602 corresponds to the first GAA FET 102 in FIG. 1, and the second GAA FET 604 corresponds to the second GAA FET 104. The CFET 600, however, differs from the CFET 100 in FIG. 1 with regard to vias VIA(1)-VIA(8) and contacts CON(1)-CON(7). It should be noted that an electrical coupling between the first gate structure 612 and the second gate structure 620 is not shown in FIG. 6 but may be provided in a different cross-section (not shown) of the CFET 600 or external to the CFET 600.

FIG. 700 is a cross-sectional view of a CFET 700 with a first GAA FET 702 in a first layer 704 and a second GAA FET 706 in a second layer 708. The CFET 700 includes a third layer 710, between the first layer 704 and the second layer 708. The first GAA FET 702 and the second GAA YET 706 are formed as SOI transistors. In general, the CFET 700 corresponds to the CFET 100 in FIG. 1. However, in the CFET 700, the second GAA FET 706 is stacked face-to-back opposite the first GAA FET 702. That is, the third layer 710 in the CFET 700 is an insulating layer on which the second GAA FET 706 was formed in an SOI process. The first layer 704 is formed on insulator layer 712. The second layer 708 is formed on the third layer 710, and the third layer 710 is bonded to the first layer 704. A base layer 714 and contact layer 716 are formed on the second layer 708, and a contact layer 718 is formed on the insulator layer 712. The vias VIA(1)-VIA(9) and contacts CON(1)-CON(7) correspond to the same labeled features in FIG. 1.

FIG. 8 is a cross-sectional view of a CFET 800, which includes a first GAA FET 802 formed on a first insulator layer 804, and a second GAA FET 806 formed on a second insulator layer 808. The CFET 800 corresponds to the CFET 600 in FIG. 6, except that the second GAA FET 806 is stacked face-to-back with the second insulator layer 808 bonded to a first layer 810, including the first GAA FET 802, as discussed with regard to the CFET 700.

Figure 9:
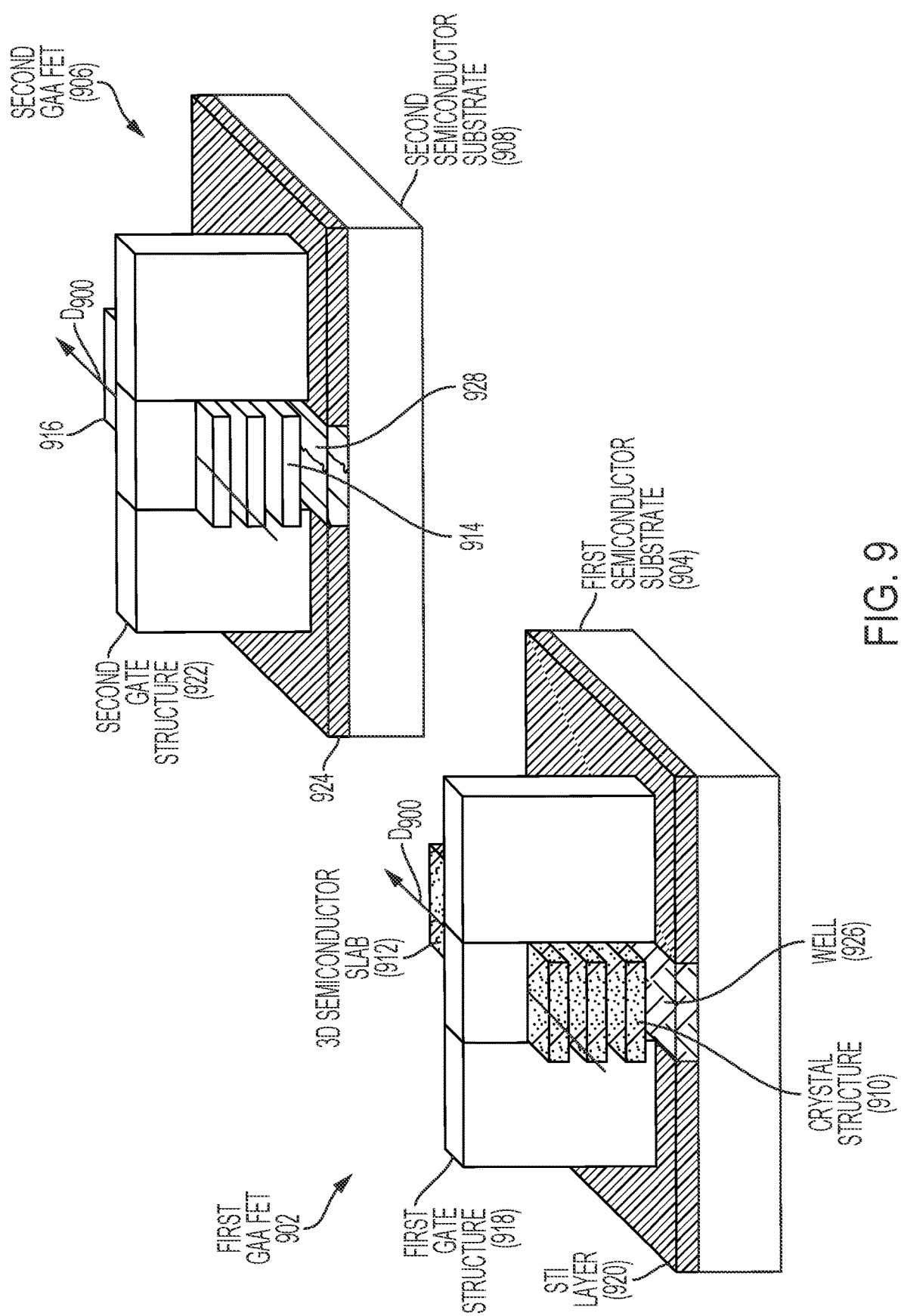
FIG. 9 is an illustration of a first GAA FET formed on a first semiconductor substrate and a second GAA FET firmed on a second semiconductor substrate such that orientations of the crystal structures of the channel regions of the first GAA FET and the second GAA FET can be different.

FIG. 9 is an illustration of a first GAA FET 902 on a first semiconductor substrate 904 and an illustration of a second GAA FET 906 on a second semiconductor substrate 908. Because the first GAA FET 902 and the second GAA FET 906 are formed on different semiconductor substrates, an orientation of a crystal structure 910 of one or more 3D semiconductor slabs 912 in the first GAA FET 902 can be different than an orientation of a crystal structure 914 of one or more 3D semiconductor slabs 916 of the second GAA FET 906. As an example, the first GAA FET 902 may be a P-type FET in which the at least one 3D semiconductor slabs 912 has a (110) surface orientation, and the second GAA FET 906 may be an N-type FET in which the at least one 3D semiconductor slab 916 has a (100) surface orientation, for example. It should be understood that other surface orientations of the crystal structures 910 and 914 are possible because they are formed separately on different semiconductor substrates 904 and 908. The 3D semiconductor slabs 912 and 916 may both have a channel direction $D_{900}$ of <100>, which corresponds to the X-axis direction in FIG. 9. The first GAA FET 902 and the second GAA FET 906 are formed as bulk transistors and are shown in a perspective view without epitaxial source/drains at either end of the 3D semiconductor slabs 912 and 916 to provide a clearer view of certain features. Here, it can be seen that a first gate structure 918 is formed on an STI layer 920 to be electrically isolated from the first semiconductor substrate 904. A second gate structure 922 is formed on an STI layer 924 on the second semiconductor substrate 908.

The first GAA FET 902 includes a well 926 between the 3D semiconductor slab 912 and the first semiconductor substrate 904. The well 926 is provided to reduce or avoid a leakage current path in the channel direction $D_{900}$ through the first semiconductor substrate 904 when the first GAA FET 902 is inactive. Reducing leakage current can improve performance and reduce power consumption of the first GAA FET 902.

Figure 10:
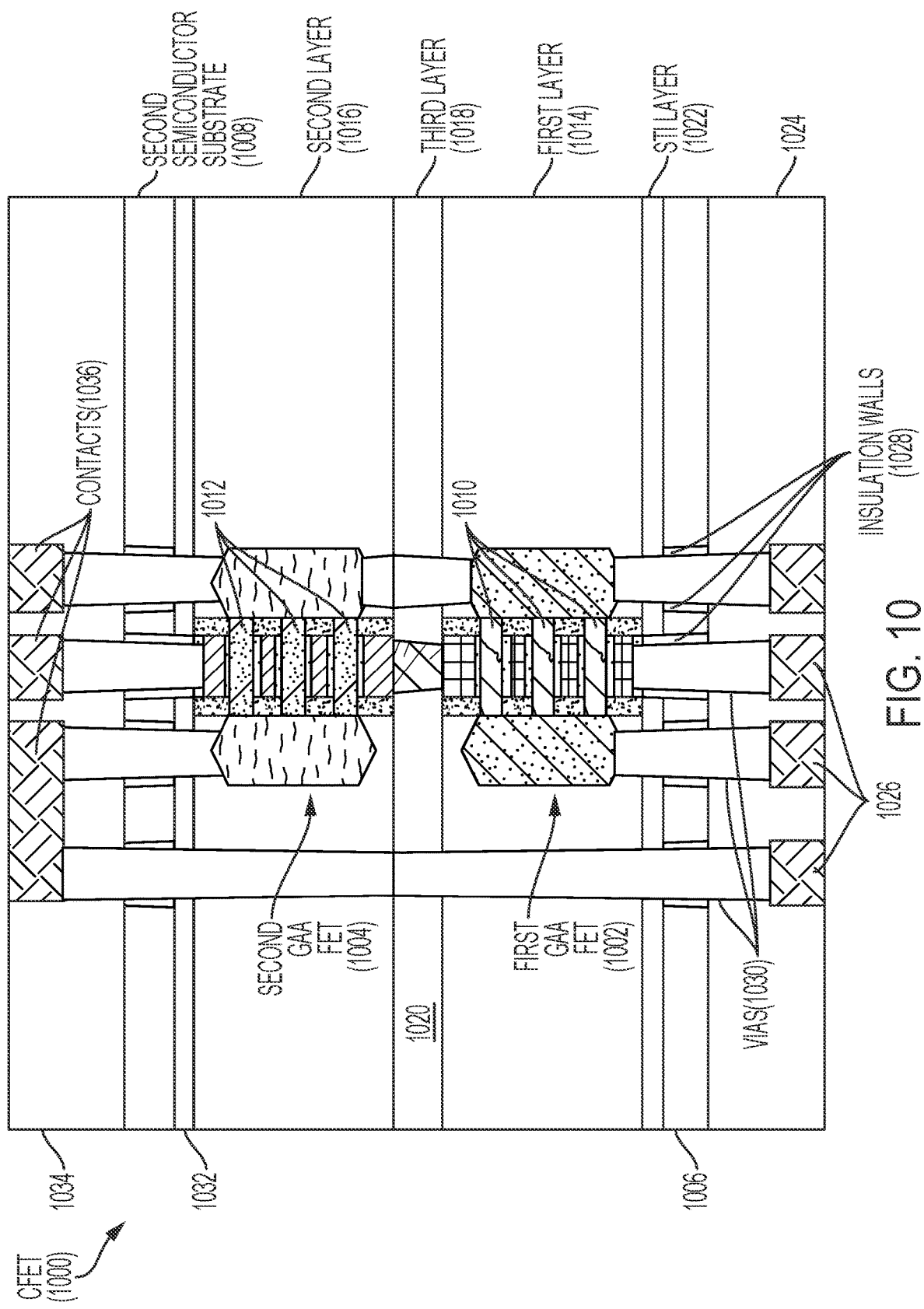
FIGS. 10-12 are illustrations of cross-sectional side views of examples of stacked GAA CFETs formed on semiconductor substrates.
Figure 11:
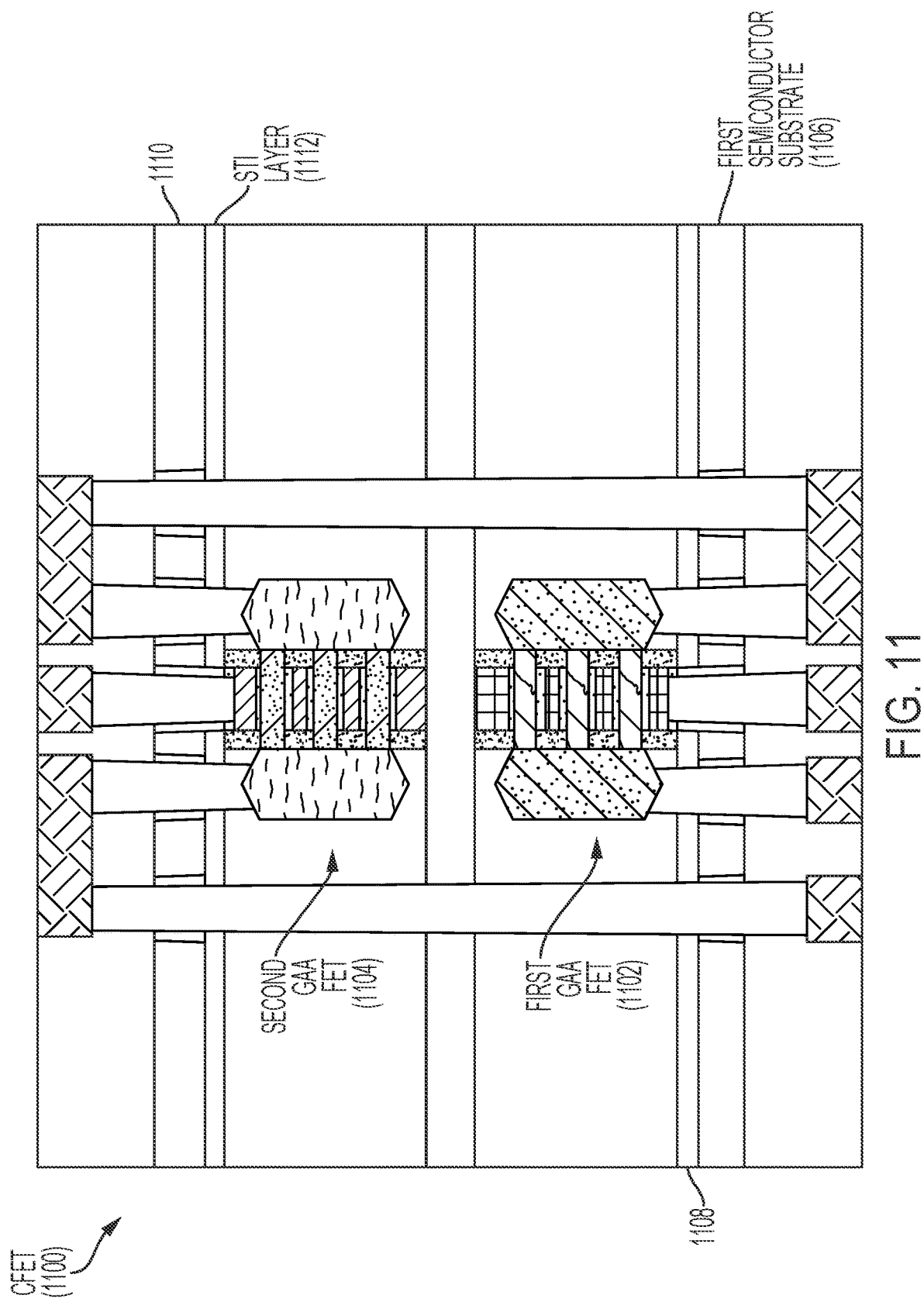
Figure 12:
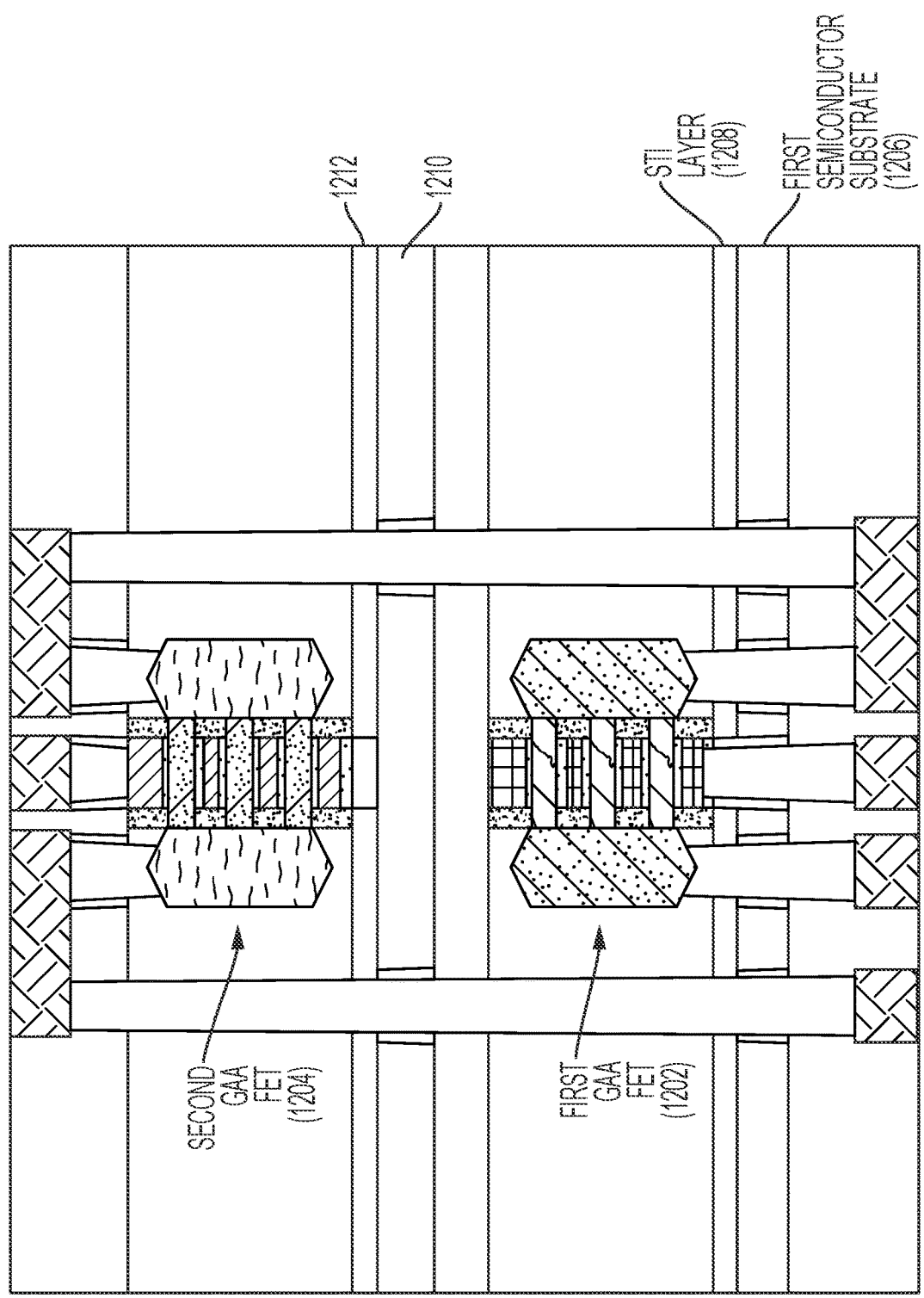

In an example in which the first GAA FET 902 is a P-type FET, the well 926 may be an N+ well, which is doped with a high concentration of N-type dopants. In an example in which the first GAA FET 902 is an N-type FET, the well 926 may be a P+ well doped with a high concentration of P-type dopants. In this regard, the second GAA FET 906 also has a well 928 between the 3D semiconductor slab 916 and the second semiconductor substrate 908. Wells corresponding to the well 926 and the well 928 may not be visible in FIGS. 10-12 because vias are formed through these wells at the location of the illustrated cross-sections, FIGS. 10-12 are illustrations of cross-sectional side views of examples of stacked GAA CFET circuits formed on semiconductor substrates. Features of FIGS. 10-12 that correspond to features of previously present figures may not be labeled and separately described to avoid redundancy. FIG. 10 is an illustration of a cross-sectional side view of a CFET 1000. The CFET 1000 includes a first GAA FET 1002 and a second GAA FET 1004 stacked in a face-to-face configuration. The CFET 1000 corresponds to the first GAA FET 102 and the second GAA FET 104 in FIG. 1, except that the first GAA FET 1002 and the second GAA FET 1004 are bulk type transistors formed on first and second semiconductor substrates 1006 and 1008, respectively, rather than on the first and second insulator layers 204 and 208.

The first GAA FET 1002 includes 3D semiconductor slabs 1010 that may be formed from the first semiconductor substrate 1006. The second GAA FET 1004 includes 3D semiconductor slabs 1012 that may be formed from the second semiconductor substrate 1008. The first GAA FET 1002 is included in a first layer 1014, and the second GAA FET 1004 is in a second layer 1016. The CFET 1000 includes a third layer 1018, which may be a bonding layer comprising an oxide or other bonding material 1020. The CFET 1000 includes the first semiconductor substrate 1006 and an STI layer adjacent to the first layer 1014. The CFET 1000 further includes a first contact layer 1024 including contacts 1026. Due to the conductivity of the first semiconductor substrate 1006, an insulation wall 1028 is provided between each of vias 1030 and the first semiconductor substrate 1006. The CFET 1000 further includes an STI layer 1032 between the second layer 1016 and the second semiconductor substrate 1008. A second contact layer 1034 is formed on the second semiconductor substrate 1008, including contacts 1036.

FIG. 11 is an illustration of a cross-sectional view of a CFET 1100 in which a first GAA FET 1102 and a second GAA FET 1104 are stacked opposite each other in a face-to-face configuration, which corresponds to the CFET 600 in FIG. 6, except that the CFET 1100 is a bulk type device rather than an SOI device. Differences between the CFET 1100 and the CFET 600 include having a first semiconductor substrate 1106 and an STI layer 1108, in which the CFET 600 includes the bottom base layer 628, and having a second semiconductor substrate 1110 and an STI layer 1112 in place of the top base layer 630 in FIG. 6.

FIG. 12 is an illustration of a cross-sectional view of a CFET 1200 in which a first GAA FET 1202 and a second GAA FET 1204 are stacked face-to-back, which corresponds to the CFET 800 in FIG. 8. However, the CFET 1200 is a bulk type transistor, which causes differences between the CFET 1200 and the CFET 800, including the CFET 1200 having a first semiconductor substrate 1206 and an STI layer 1208, in which the CFET 800 includes the first insulator layer 804, and the CFET 1200 including a second semiconductor substrate 1210 and an STI layer 1212 in place of the second insulator layer 808 in FIG. 8.

It is noted that because each of the CFETs 1000-1200 in FIGS. 10-12 are formed according to the methods described above, in which the 3D semiconductor slabs of a first GAA FET and the 3D semiconductor slabs of a second GAA FET may be formed with different crystal structure orientations to improve performance of the P-type devices without reducing performance of N-type devices. In this context, the term "3D semiconductor slab" refers to a thin layer of semiconductor material having a crystal structure.

According to aspects disclosed herein, the stacked GAA CFET may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 13:
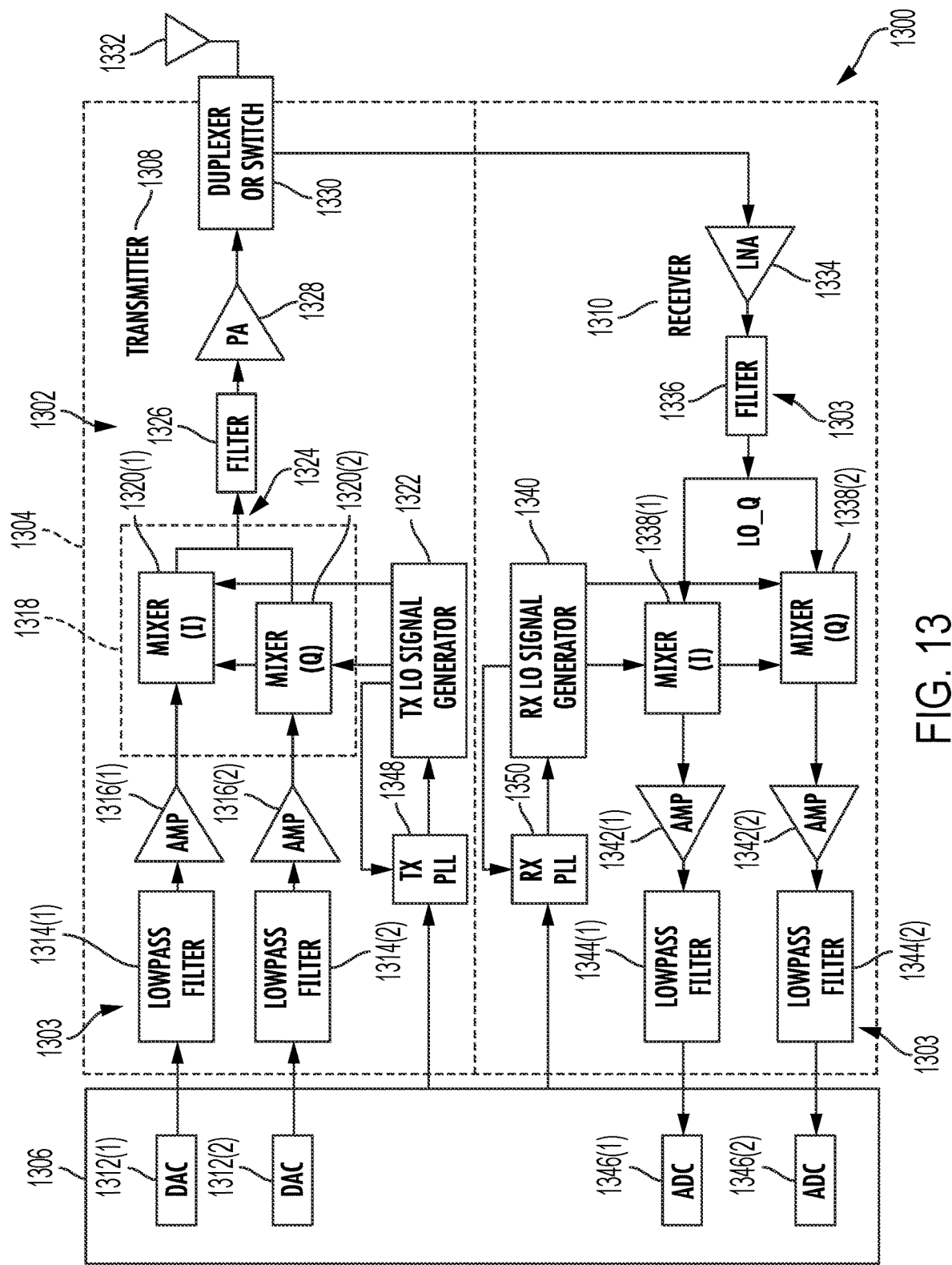
FIG. 13 is a block diagram of an exemplary wireless communications device that can include the stacked GAA CFET of FIG. 1.

FIG. 13 illustrates an exemplary wireless communications device 1300 that includes radio-frequency (RF) components formed from one or more integrated circuits (ICs) 1302, which can include an exemplary stacked GAA CFET in which gate structures of a first GAA FET and a second GAA FET are stacked opposite each other, as illustrated in FIGS. 1, 6-8, and 10-12, and according to any of the aspects disclosed herein. The wireless communications device 1300 may include or be provided in any of the above-referenced devices as examples. As shown in FIG. 8, the wireless communications device 1300 includes a transceiver 1304 and a data processor 1306. The data processor 1306 may include a memory to store data and program codes. The transceiver 1304 includes a transmitter 1308 and a receiver 1310 that support bi-directional communications. In general, the wireless communications device 1300 may include any number of transmitters 1308 and/or receivers 1310 for any number of communication systems and frequency bands. All or a portion of the transceiver 1304 may be implemented on one or more analog ICs, RFICs, mixed-signal ICs, etc.

The transmitter 1308 or the receiver 1310 may be implemented with a super-heterodyne architecture or a direct-conversion architecture. In the super-heterodyne architecture, a signal is frequency-converted between RE and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 1300 in FIG. 13, the transmitter 1308 and the receiver 1310 are implemented with the direct-conversion architecture.

In the transmit path, the data processor 1306 processes data to be transmitted and provides I and Q analog output signals to the transmitter 1308. In the exemplary wireless communications device 1300, the data processor 1306 includes digital-to-analog converters (DACs) 1312(1), 1312(2) for converting digital signals generated by the data processor 1306 into the I and Q analog output signals, e.g., I and Q output currents, for further processing.

Within the transmitter 1308, lowpass filters 1314(1), 1314(2) filter the I and Q analog output signals, respectively, to remove undesired signals caused by the prior digital-to-analog conversion. Amplifiers (AMPs) 1316(1), 1316(2) amplify the signals from the lowpass filters 1314(1), 1314(2), respectively, and provide I and Q baseband signals. An upconverter 1318 upconverts the I and Q baseband signals with I and Q transmit (TX) local oscillator (LO) signals from a TX LO signal generator 1322 through mixers 1320(1), 1320(2) to provide an upconverted signal 1324. A filter 1326 filters the upconverted signal 1324 to remove undesired signals caused by the frequency upconversion as well as noise in a receive frequency band. A power amplifier (PA) 1328 amplifies the upconverted signal 1324 from the filter 1326 to obtain the desired output power level and provides a transmit RE signal. The transmit RF signal is routed through a duplexer or switch 1330 and transmitted via an antenna 1332.

In the receive path, the antenna 1332 receives signals transmitted by base stations and provides a received RF signal, which is routed through the duplexer or switch 1330 and provided to a low noise amplifier (LNA) 1334. The duplexer or switch 830 is designed to operate with a specific receive (RX)-to-TX duplexer frequency separation, such that RX signals are isolated from TX signals. The received RE signal is amplified by the LNA 1334 and filtered by a filter 1336 to obtain a desired RF input signal. Downconversion mixers 1338(1), 1338(2) mix the output of the filter 1336 with I and Q RX LO signals (i.e., LO_I and LO_Q) from an RX LO signal generator 1340 to generate I and Q baseband signals. The I and Q baseband signals are amplified by AMPs 1342(1), 1342(2) and further filtered by lowpass filters 1344(1), 1344(2) to obtain I and Q analog input signals, which are provided to the data processor 1306. In this example, the data processor 1306 includes analog-to-digital converters (ADCs) 1346(1), 1346(2) for converting the analog input signals into digital signals to be further processed by the data processor 1306.

In the wireless communications device 1300 of FIG. 13, the TX LO signal generator 1322 generates the I and Q TX LO signals used for frequency upconversion, while the RX LO signal generator 1340 generates the I and Q RX LO signals used for frequency downconversion. Each LO signal is a periodic signal with a particular fundamental frequency. A Tx phase-locked loop (PLL) circuit 1348 receives timing information from the data processor 1306 and generates a control signal used to adjust the frequency and/or phase of the TX LO signals from the TX LO signal generator 1322. Similarly, an RX I'LL circuit 1350 receives timing information from the data processor 1306 and generates a control signal used to adjust the frequency and/or phase of the RX LO signals from the RX LO signal generator 1340.

Wireless communications devices 1300 can include an exemplary stacked GAA CFET circuit in which gate structures of a first GAA FET and a second GAA FET are stacked opposite each other, as illustrated in FIGS. 1, 6-8, and 10-12, and according to any of the aspects disclosed herein, may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 14:
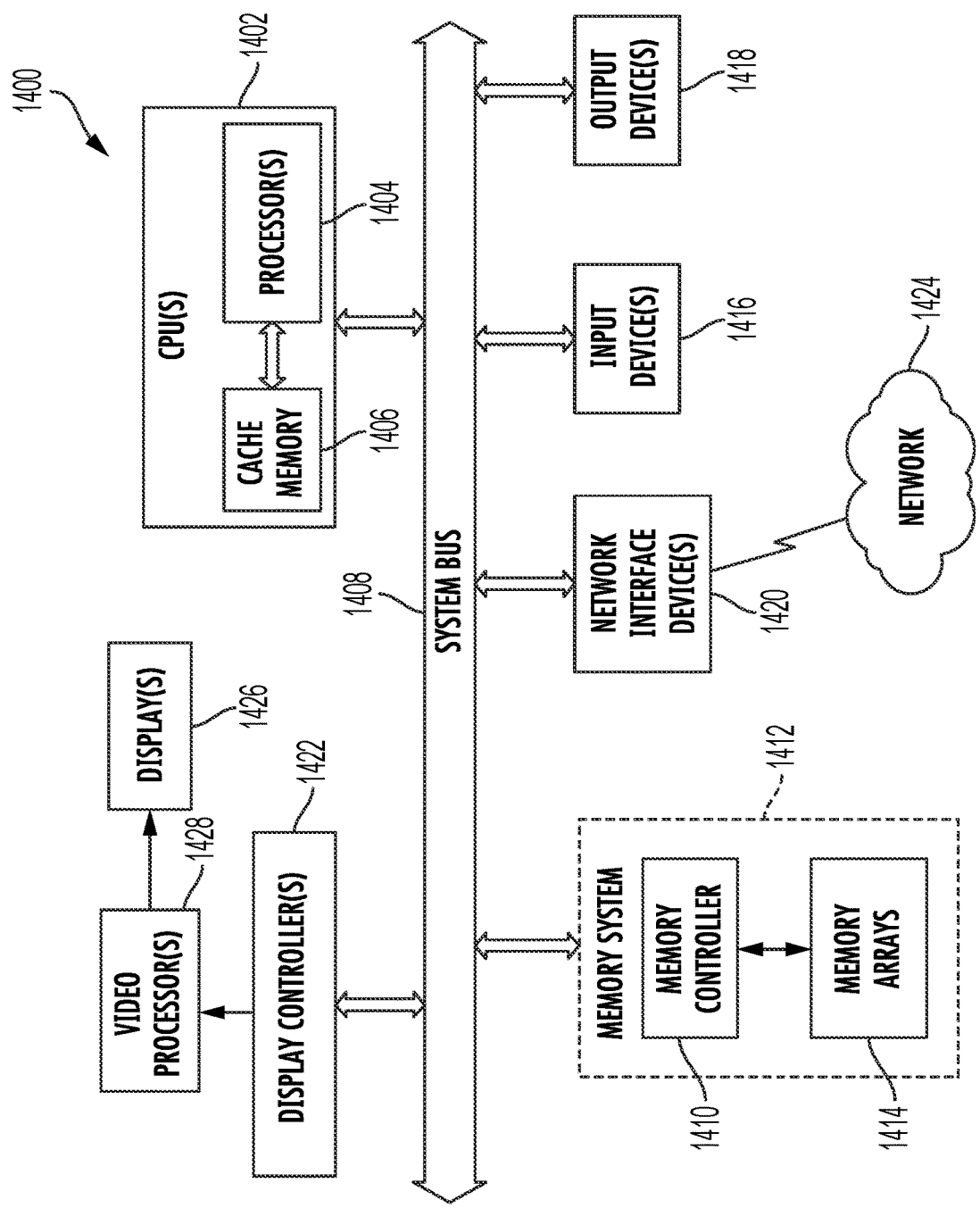
FIG. 14 is a block diagram of an exemplary processor-based system that can include the stacked GAA CFET of FIG. 1.

FIG. 14 illustrates an example of a processor-based system 1400 including circuits including an exemplary stacked GAA CFET circuit in which gate structures of a first GAA FET and a second GAA FET are stacked opposite each other, as illustrated in FIGS. 1, 6-8, and 10-12, and according to any aspects disclosed herein. In this example, the processor-based system 1400 includes one or more central processor units (CPUs) 1402, which may also be referred to as CPU or processor cores, each including one or more processors 1404. The CPU(s) 1402 may have cache memory 1406 coupled to the processor(s) 1404 for rapid access to temporarily stored data. The CPU(s) 1402 is coupled to a system bus 1408 and can intercouple master and slave devices included in the processor-based system 1400. As is well known, the CPU(s) 1402 communicates with these other devices by exchanging address, control, and data information over the system bus 1408. For example, the CPU(s) 1402 can communicate bus transaction requests to a memory controller 1410 as an example of a slave device. Although not illustrated in FIG. 14, multiple system buses 1408 could be provided; wherein each system bus 1408 constitutes a different fabric.

Other master and slave devices can be connected to the system bus 1408. As illustrated in FIG. 14, these devices can include a memory system 1412 that includes the memory controller 1410 and one or more memory arrays 1414, one or more input devices 1416, one or more output devices 1418, one or more network interface devices 1420, and one or more display controllers 1422, as examples. The input device(s) 1416 can include any type of input device, including, but not limited to, input keys, switches, voice processors, etc. The output device(s) 1418 can include any type of output device, including, but not limited to, audio, video, other visual indicators, etc. The network interface device(s) 1420 can be any device configured to allow an exchange of data to and from a network 1424. The network 1424 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1420 can be configured to support any type of communications protocol desired.

The CPU(s) 1402 may also be configured to access the display controller(s) 1422 over the system bus 1408 to control information sent to one or more displays 1426. The display controller(s) 1422 sends information to the display(s) 1426 to be displayed via one or more video processors 1428, which process the information to be displayed into a format suitable for the display(s) 1426. The display(s) 1426 can include any type of display, including, but not limited to, a cathode ray tube (CRT), a liquid crystal display (LCD), a plasma display, or a light-emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or another computer-readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read-Only Memory (ROM), Electrically Programmable ROM (EPROM), Electrically Erasable Programmable ROTI (EEPROM), registers, a hard disk, a removable disk, a CD-ROM, or any other form of computer-readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. Alternatively, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in several different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using various technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. A stacked complementary field-effect transistor (CFET) comprising:
    a first gate-all-around (GAA) FET of a first type, the first GAA FET comprising:
        a first channel region comprising a first crystal structure comprising a first orientation; and
        a first gate structure surrounding the first channel region; and
    a second GAA FET of a second type, the second GAA FET comprising:
        a second channel region comprising a second crystal structure comprising a second orientation different than the first orientation; and
        a second gate structure surrounding the second channel region.

2. The stacked CFET of clause 1, wherein:
the first orientation of the first crystal structure is (100); and
the second orientation of the second crystal structure is (110).
3. The stacked CFET of clause 1 or clause 2, wherein:
the first GAA FET of the first type is an N-type FET; and
the second GAA FET of the second type is a P-type
4. The stacked CFET of any of clauses 1 to 3, further comprising:
a first layer comprising the first GAA FET;
a second layer comprising the second GAA FET; and
a third layer between the second layer and the first layer.
5. The stacked CFET of clause 4, wherein the third layer comprises a bonding layer bonding the first layer to the second layer.
6. The stacked CFET of clause 5, wherein the bonding layer comprises an oxide layer.
7. The stacked CFET of any of clauses 4 to 6, wherein the third layer comprises a semiconductor substrate.
8. The stacked CFET of any of clauses 4 to 7, further comprising a via extending through the third layer from the first gate structure to the second gate structure.
9. The stacked CFET of any of clauses 4 to 8, further comprising:
a first dielectric layer on the first layer, the first dielectric layer comprising a first contact coupled to the first GAA FET; and
a second dielectric layer on the second layer, the second dielectric layer comprising a second contact coupled to the second GAA FET.
10. The stacked CFET of clause 9, further comprising:
a via extending from the first contact to the second contact through the first layer, the third layer, and the second layer.
11. The stacked CFET of clause 9 or clause 10, further comprising a first semiconductor substrate between the first layer and the first dielectric layer.
12. The stacked CFET of clause 11, further comprising a second semiconductor substrate between the second layer and the second dielectric layer.
13. The stacked CFET of any of clauses 1 to 12, wherein a first epitaxial region coupled to the first channel region of the first GAA FET is coupled to a second epitaxial region coupled to the second channel region of the second GAA FET.
14. The stacked CFET of any of clauses 1 to 13 integrated into an integrated circuit (IC).
15. The stacked CFET of any of clauses 1 to 14 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.
16. A method of making a stacked complementary field-effect transistor (CFET), the method comprising:
forming a first gate-all-around (GAA) FET of a first type, the first GAA YET comprising:
a first channel region comprising a first crystal structure comprising a first orientation; and
a first gate structure surrounding the first channel region;
forming a second GAA FET of a second type, the second GAA FET comprising:
a second channel region comprising a second crystal structure comprising a second orientation different than the first orientation; and
a second gate structure surrounding the second channel region.
17. The method of clause 16, wherein:
forming the first GAA FET further comprises forming the first GAA FET in a first layer on a first oxide layer on a first substrate; and
forming the second GAA FET further comprises forming the second GAA FET in a second layer on a second oxide layer on a second substrate.
18. The method of clause 16 or clause 17, wherein:
the first orientation is a (100) orientation; and
the second orientation is a (110) orientation.
19. The method of clause 17 or clause 18, further comprising:
forming a bonding layer on one of the first layer and the second layer; and
stacking the second layer on the first layer.
20. The method of clause 19, further comprising:
forming a via extending through the bonding layer coupling the first gate structure to the second gate structure.

What is claimed is:
1. A stacked complementary field-effect transistor (CFET) comprising:
a first gate-all-around (GAA) FET of a first type, the first GAA FET comprising:
a first channel region comprising a first crystal structure comprising a first orientation; and
a first gate structure surrounding the first channel region; and
a second GAA FET of a second type, the second GAA FET comprising:
a second channel region comprising a second crystal structure comprising a second orientation different than the first orientation; and
a second gate structure surrounding the second channel region.
2. The stacked CFET of claim 1, wherein:
the first orientation of the first crystal structure comprises a surface orientation of (100); and
the second orientation of the second crystal structure comprises a surface orientation of (110).
3. The stacked CFET of claim 1, wherein:
the first GAA FET of the first type is an N-type FET; and
the second GAA FET of the second type is a P-type FET.
4. The stacked CFET of claim 1, further comprising:
a first layer comprising the first GAA FET;
a second layer comprising the second GAA FET; and
a third layer between the second layer and the first layer, wherein:
the first channel region extends in a first direction and in a second direction orthogonal to the first direction.

5. The stacked CFET of claim 4, wherein the third layer comprises a bonding layer bonding the first layer to the second layer.

6. The stacked CFET of claim 5, wherein the bonding layer comprises an oxide layer.

7. The stacked CFET of claim 4, wherein the third layer comprises a semiconductor substrate.

8. The stacked CFET of claim 4, further comprising a via extending through the third layer from the first gate structure to the second gate structure,
wherein:
the via extends in a third direction orthogonal to the first direction and the second direction directly between the first channel region and the second channel region.

9. The stacked CFET of claim 4, further comprising:
a first dielectric layer on the first layer, the first dielectric layer comprising a first contact coupled to the first GAA FET; and
a second dielectric layer on the second layer, the second dielectric layer comprising a second contact coupled to the second GAA FET.

10. The stacked CFET of claim 9, further comprising:
a via extending from the first contact to the second contact through the first layer, the third layer, and the second layer.

11. The stacked CFET of claim 9, further comprising a first semiconductor substrate between the first layer and the first dielectric layer.

12. The stacked CFET of claim 11, further comprising a second semiconductor substrate between the second layer and the second dielectric layer.

13. The stacked CFET of claim 1, wherein a first epitaxial region coupled to the first channel region of the first GAA FET is coupled to a second epitaxial region coupled to the second channel region of the second GAA FET.

14. The stacked CFET of claim 1 integrated into an integrated circuit (IC).

15. The stacked CFET of claim 1 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

16. A method of making a stacked complementary field-effect transistor (CFET), the method comprising:
forming a first gate-all-around (GAA) FET of a first type, the first GAA FET comprising:
a first channel region comprising a first crystal structure comprising a first orientation; and
a first gate structure surrounding the first channel region;
forming a second GAA FET of a second type, the second GAA FET comprising:
a second channel region comprising a second crystal structure comprising a second orientation different than the first orientation; and
a second gate structure surrounding the second channel region.

17. The method of claim 16, wherein:
forming the first GAA FET further comprises forming the first GAA FET in a first layer on a first oxide layer on a first substrate; and
forming the second GAA FET further comprises forming the second GAA FET in a second layer on a second oxide layer on a second substrate,
wherein:
the first channel region extends in a first direction and in a second direction orthogonal to the first direction.

18. The method of claim 16, wherein:
the first orientation comprises a surface orientation of (100) orientation; and
the second orientation comprises a surface orientation of (110) orientation.

19. The method of claim 17, further comprising:
forming a bonding layer on one of the first layer and the second layer; and
stacking the second layer on the first layer.

20. The method of claim 19, further comprising:
forming a via extending through the bonding layer coupling the first gate structure to the second gate structure.

* * * * *